US010700630B2

(12) United States Patent
Toba et al.

(10) Patent No.: US 10,700,630 B2
(45) Date of Patent: Jun. 30, 2020

(54) INVERTER THAT ADJUSTS VOLTAGE COMMAND VALUES AND CONTROL METHOD OF INVERTER

(71) Applicant: FUJI ELECTRIC CO., LTD., Kanagawa (JP)

(72) Inventors: Akio Toba, Tokyo (JP); Akihiro Odaka, Tokyo (JP); Hidetoshi Umida, Tokyo (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 16/180,231

(22) Filed: Nov. 5, 2018

(65) Prior Publication Data

US 2019/0089286 A1 Mar. 21, 2019

Related U.S. Application Data

(63) Continuation of application No. PCT/JP2017/026801, filed on Jul. 25, 2017.

(30) Foreign Application Priority Data

Sep. 29, 2016 (JP) ................................. 2016-191527
Nov. 30, 2016 (JP) ................................. 2016-231927
Dec. 22, 2016 (JP) ................................. 2016-248663

(51) Int. Cl.
*H02P 27/08* (2006.01)
*H03K 7/08* (2006.01)
(Continued)

(52) U.S. Cl.
CPC ............ *H02P 27/085* (2013.01); *H02M 1/14* (2013.01); *H02M 1/15* (2013.01); *H02M 1/32* (2013.01);
(Continued)

(58) Field of Classification Search
CPC ........................................................ H02M 1/14
See application file for complete search history.

(56) References Cited

U.S. PATENT DOCUMENTS

| 9,093,944 | B2  |   | 7/2015 | Kim    |               |
|-----------|-----|---|--------|--------|---------------|
| 2012/0019184 | A1 | * | 1/2012 | Niizuma | ........ H02P 27/08 |
|           |     |   |        |        | 318/494       |
| 2013/0155740 | A1 | * | 6/2013 | Takubo | ........ H02M 7/53875 |
|           |     |   |        |        | 363/98        |

FOREIGN PATENT DOCUMENTS

| CN | 102362427 | 2/2012 |
| CN | 103069707 | 4/2013 |

(Continued)

OTHER PUBLICATIONS

Institute of Electrical Engineers of Japan, Semiconductor Power Conversion Circuit, 8th edition, pp. 124-125, May 25, 1995.

(Continued)

*Primary Examiner* — Daniel Kessie
*Assistant Examiner* — Trinh Q Dang
(74) *Attorney, Agent, or Firm* — IPUSA, PLLC

(57) ABSTRACT

A control method of an inverter for outputting polyphase alternate-current electrical power is provided. In the control method, modified PWM pulses of respective phases for controlling semiconductor switching elements of the inverter are generated, based on an output of a counter common to the respective phases. Each of the modified PWM pulses is configured such that a total pulse width, in a period corresponding to one or more cycles of a carrier, is substantially equal to a total pulse width of an assumed PWM pulse which is obtained by comparing, with the carrier, a time average value of an output voltage of the corresponding phase in the period. Further, at least one of a (Continued)

generation timing and a generation frequency of at least one of the modified PWM pulses is changed from the assumed PWM pulse.

31 Claims, 21 Drawing Sheets

(51) Int. Cl.
*H03K 4/48* (2006.01)
*H02M 1/14* (2006.01)
*H02M 1/32* (2007.01)
*H02M 7/5395* (2006.01)
*H02M 1/15* (2006.01)
*H02M 1/00* (2006.01)

(52) U.S. Cl.
CPC ............ *H02M 7/5395* (2013.01); *H03K 4/48* (2013.01); *H03K 7/08* (2013.01); *H02M 2001/0009* (2013.01); *H02M 2001/327* (2013.01)

(56) References Cited

FOREIGN PATENT DOCUMENTS

| | | |
|---|---|---|
| JP | 2013-169026 | 8/2013 |
| JP | 2013-183636 | 9/2013 |
| JP | 2015-053824 | 3/2015 |
| WO | 2017-034028 | 3/2017 |

OTHER PUBLICATIONS

Takashi Kimura et al., "High-power-density Inverter Technology for Hybrid and Electric Vehicle Applications", Hitachi Review, vol. 95, No. 11, pp. 42-47, Nov. 2013.

Koroku Nishizawa et al., "Space Vector Modulation to Reduce Input Current Harmonics of two-level VSI Corresponding to the Power Factor Change", Proceedings of Joint Technical Meeting on Semiconductor Power Conversion / Motor Drive, Institute of Electrical Engineers of Japan, Hokkaido Branch, SPC-15-133, pp. 1/6-6/6, Aug. 28, 2015, with English Abs.

International Search Report dated Oct. 17, 2017 with respect to PCT/JP2017/026801.

Office Action dated Apr. 3, 2020 issued with respect to the corresponding Chinese Patent Application No. 201780029428.0.

\* cited by examiner

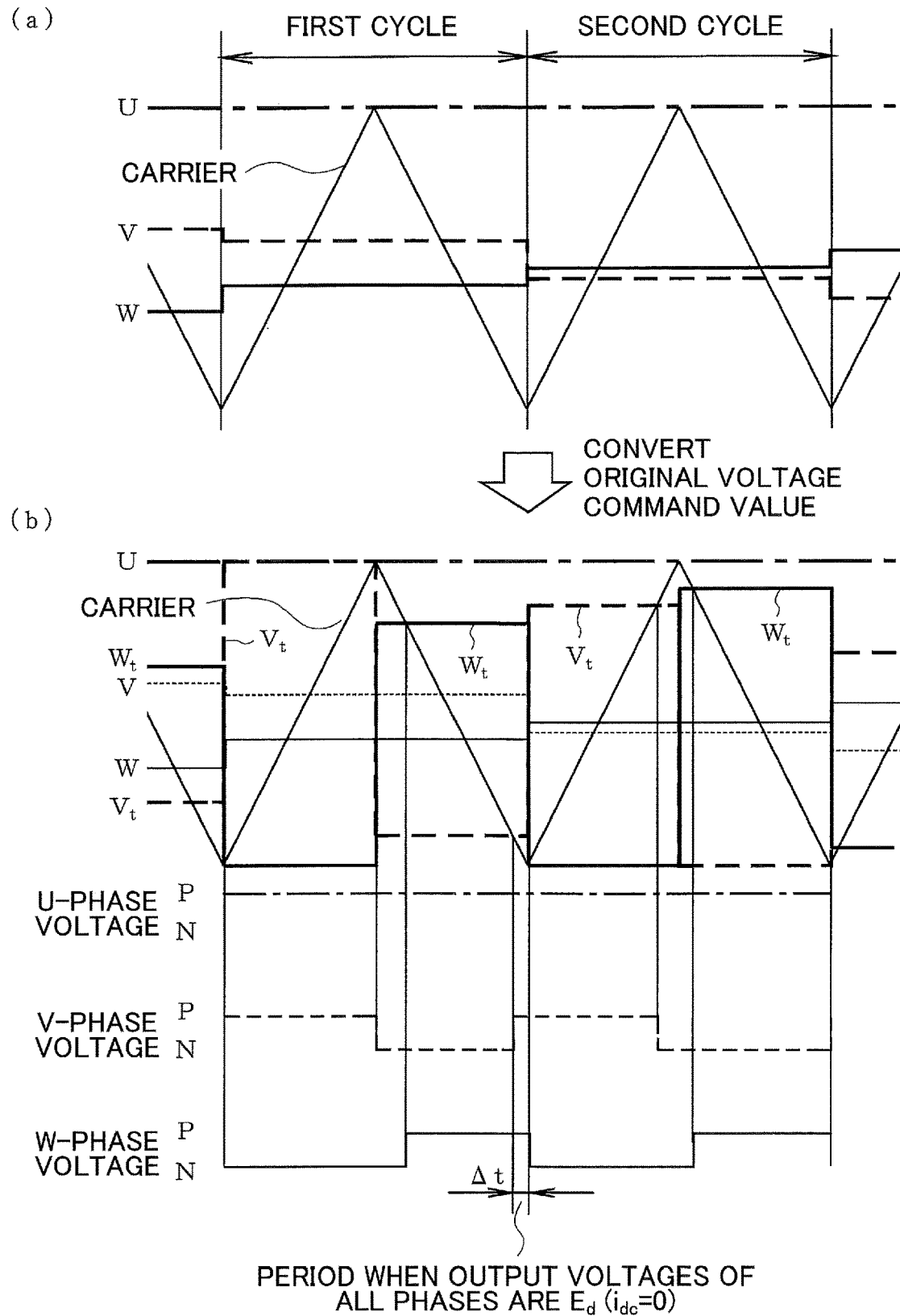

($\lambda = 0.2$, $A_U = A_V = A_W = 1$, $\cos\phi = 1$, $-30° \leq \theta \leq 30°$)

($\lambda = 0.2$, $A_U = 1$, $A_V = A_W = 1.4$, $\cos\phi = 1$, $-30° \leq \theta \leq 30°$)

($\lambda = 0.2$, $A_U = 1$, $A_V = A_W = 2$, $\cos\phi \leq 1$, $-30° \leq \theta \leq 30°$)

INVERTER THAT ADJUSTS VOLTAGE COMMAND VALUES AND CONTROL METHOD OF INVERTER

CROSS-REFERENCE TO RELATED APPLICATION

This application is a continuation of International Application PCT/JP2017/026801 filed on Jul. 25, 2017 and designated the U.S., which claims priority to Japanese Patent Application No. 2016-191527 filed on Sep. 29, 2016, Japanese Patent Application No. 2016-231927 filed on Nov. 30, 2016, and Japanese Patent Application No. 2016-248663 filed on Dec. 22, 2016. The contents of these applications are incorporated herein by reference in their entirety.

BACKGROUND OF THE INVENTION

1. Field of the Invention

The present invention relates to a control method of an inverter, a control device, and an inverter for suppressing heat generation of a capacitor of a direct-current part of an inverter main circuit by reducing a ripple current component flowing through the capacitor. For example, the present invention relates to a PWM pulse generation technique for a three-phase inverter.

2. Description of the Related Art

FIG. 18 is a diagram illustrating a configuration of a main circuit of a three-phase inverter.

In FIG. 18, a capacitor C is connected in parallel with a direct-current (DC) voltage source B. At each end of the capacitor C, semiconductor switching elements ($U_P$, $V_P$, $W_P$, $U_N$, $V_N$, and $W_N$) formed of an IGBT or the like are connected. A connection point of two switching elements for each phase is connected to a three-phase alternate-current (AC) load M, such as a motor, via a corresponding one of AC output terminals $T_U$, $T_V$, and $T_W$.

In FIG. 18, L is a reactor (which is an intentionally connected reactor, or a floating reactor unintentionally existing on a wire), P and N are respectively a positive electrode of the DC voltage source B and a negative electrode of the DC voltage source B.

Further, $E_d$ represents a voltage of the DC voltage source B, $V_C$ represents a voltage of the capacitor C, $i_{bat}$ represents an output current of the DC voltage source B, $i_C$ represents a current flowing through the capacitor C, $i_{dc}$ represents a DC current flowing through the main circuit, and $i_U$, $i_V$, and $i_W$ represent output currents of the respective phases.

This three-phase inverter converts a DC voltage into a three-phase AC voltage having a desired frequency and magnitude, by turning on and off the switching elements $U_P$, $V_P$, $W_P$, $U_N$, $V_N$, and $W_N$ at a predetermined time ratio, and supplies the three-phase AC voltage to the load M.

As a method of turning on and off the switching elements $U_P$, $V_P$, $W_P$, $U_N$, $V_N$, and $W_N$, in other words, a control method of an inverter, for example, a method of obtaining actuation pulses (PWM pulses) for the switching elements $U_P$, $V_P$, $W_P$, $U_N$, $V_N$, and $W_N$, by comparing a triangle wave as a carrier with an output voltage command value (modulating signal) of each of the three phases, is generally known. This type of control method is disclosed as a PWM control method, in Patent Document 1 or Non-Patent Document 1, for example.

FIG. 19 illustrates an example of operation waveforms obtained by turning on and off the switching elements $U_P$, $V_P$, $W_P$, $U_N$, $V_N$, and $W_N$ in FIG. 18, based on PWM pulses obtained by comparing a triangle wave as a carrier with respective output voltage command values U, V, and W of the three phases. The operation waveforms obtained in FIG. 19 are waveforms obtained in a case in which output currents $i_U$, $i_V$, and $i_W$ are sine waves and a power factor is 1.

The output voltage command values U, V, and W in FIG. 19 are for performing, what is called, two-phase modulation (two-arm modulation). The two-phase modulation is a well-known modulation method, in which switching states (on/off state) of switching elements for one of three phases are not changed for a certain period of time, and in which switching states of switching elements for other phases are controlled. As details of the two-phase modulation are disclosed in Non-Patent Document 1, for example, description of the two-phase modulation is omitted.

When the three-phase inverter is controlled with the two-phase modulation, switching loss that occurs by turning on or off a switching element can be reduced, while maintaining voltage between output lines of the three phases to be sine waves. Also, other merits can be obtained by using the two-phase modulation. For example, voltage usage rate of the inverter improves.

According to FIG. 19, a waveform of $i_{dc}$ becomes a pulse-like waveform because turning on and off of the switching elements $U_P$, $V_P$, $W_P$, $U_N$, $V_N$, and $W_N$ are performed. That is, it is found that the DC current of the main circuit $i_{dc}$ contains a DC component and an AC component.

As illustrated in FIG. 18, the reactor L is disposed between the DC voltage source B and the capacitor C. The DC current $i_{ds}$ is a sum of the DC component $i_{bat}$, which is current flowing from the DC voltage source B to the reactor L, and the AC component $i_C$ which is current supplied from the capacitor C. That is, $i_{dc}$ is ($i_{bat}+i_C$).

If the above mentioned AC component, that is, a ripple current component $i_C$ flows through the capacitor C, the capacitor C is self-heated and a temperature of the capacitor C is raised. In general, a life of a capacitor becomes shorter when a temperature becomes higher. To suppress increase in temperature, a capacitor of larger capacity than required needs to be used, or a cooling means for actively cooling a capacitor is required.

Thus, for example, Non-Patent Document 2 discloses a technique of cooling a capacitor in a main circuit, which transfers heat of the capacitor, by thermal conduction, to a water cooling jacket disposed in a periphery of the capacitor.

Further, Non-Patent Document 3 discloses a technique of suppressing a harmonic component contained in a DC current, that is, of suppressing a ripple current component $i_C$ of a capacitor, by switching between a prior conventional space vector control method and another space vector control method for choosing a space vector such that an overlap of output line voltage pulses is minimized, in accordance with fluctuation of a load power factor.

The relationship between a carrier, an output voltage command value of each phase, and an output voltage of each phase in the prior conventional space vector control method will be described with reference to FIG. 20.

FIG. 20 is a diagram of operation waveforms in a case in which a triangle wave is used as a carrier, similar to the case in FIG. 19. By turning on and off the switching elements $U_P$, $V_P$, $W_P$, $U_N$, $V_N$, and $W_N$, based on PWM pulses obtained by comparing a carrier with respective output voltage command values U, V, and W of the respective phases, U-phase voltage, V-phase voltage, and W-phase voltage are output. Level P and level N of the U-phase voltage, the V-phase voltage, and the W-phase voltage respectively correspond to a voltage ($E_d$) of the positive electrode P of the DC voltage source B, and a voltage (0) of the negative electrode N of the DC voltage source B.

In the diagram of FIG. 20, during a first cycle and a second cycle of the carrier, the output voltage command value of the U-phase is fixed, and the other phases (V-phase and W-phase) act as modulation phases. By changing the output voltage command values V and W, and by comparing V and W with the carrier, PWM pulses are generated. In digital control, for example, detection of voltage and current of each phase, and calculation, determination, and preset of output voltage command values at a next carrier cycle are performed at a first cycle. Then, at a time when a second cycle is started, the output voltage command value of each phase is changed.

In FIG. 20, Δt represents periods when the DC current of the main circuit $i_{dc}$ is 0 because the U-phase, V-phase, and W-phase all output the voltage $E_d$ of the positive electrode P of the DC voltage source B. A typical case in which the ripple current component $i_C$ of the capacitor C increases includes a case in which a rate of change of the DC current $i_{dc}$ increases because the period Δt becomes longer.

FIG. 21 is a diagram of operation waveforms in a case in which a sawtooth wave is used as a carrier, and Δt represents periods when the DC current $i_{dc}$ is 0, same as FIG. 20.

In both cases in FIG. 20 and FIG. 21, because a time when voltage pulses (leading edge and trailing edge of pulses) of the V-phase and W-phase of modulation phases occur is regulated by a carrier common to each phase, degree of freedom of choice of timing for generating a voltage pulse is not high. This means that the degree of freedom for decreasing the ripple current component $i_C$ by shortening the period Δt when $i_{dc}$ is 0 is also low.

That is, in the above described conventional technique, there is a limit to the shortening of the period Δt when $i_{dc}$ is 0, and an improved technique is required.

In light of the above problem, the applicant has filed an invention regarding a controlling method of an inverter, a controller, and an inverter which is effective for reducing a ripple current component of a capacitor, which is Japanese Patent Application No. 2015-166526 and PCT/JP2016/075045 (hereinafter, these applications are referred to as prior applications).

These prior applications mention an inverter configured by n number of (n is a plural number) series circuits each including two semiconductor switching elements and being connected in parallel with a direct-current voltage source, each connection point of the two switching elements being connected, as an AC output terminal of one phase, to one of the phases of an n-phase AC load. When obtaining n-phase AC voltage of desired magnitude and desired frequency by changing time ratio of a DC voltage applied to the AC output terminals based on on/off operations of the switching elements, the inverter is controlled such that a state in which at least one of the AC output terminals of the n phases is connected to the positive or negative electrode of the DC voltage source for a predetermined period is maintained, and in which the other AC output terminals are connected to the negative or positive electrode of the DC voltage source for a period shorter than the predetermined period, is maintained. Further, the inverter is controlled such that, by controlling the switching elements of each phase during the period, a time when the AC output terminals of all the n phases are connected to the positive or negative electrode of the DC voltage source simultaneously is shortened as possible (for example, the time is made to zero).

In the prior applications, as illustrated in FIG. 22, two triangle waves (or two sawtooth waves) 1 and 2 being inverted in phase from each other are used as carriers for performing PWM control of the inverter. Also, the output voltage command values of the phases other than a specific phase are configured to correspond to one of the carriers such that the output voltage command values of the phases other than a specific phase do not correspond to the same carrier, and PWM pulses of respective phases are generated by comparing the respective output voltage command values with corresponding carriers.

According to the prior applications mentioned above, as is apparent from a chart illustrated in "Period 1" of FIG. 22, by eliminating a time when the AC output terminals of all the n phases are connected to the positive or negative electrode of the DC voltage source simultaneously (that is, a time when $i_{dc}$ is zero), a rate of change of the DC current $i_{dc}$ is reduced. Accordingly, the ripple current component $i_C$ flowing through the capacitor C is reduced, and heat generation can be suppressed.

However, in the above mentioned case, because two types of carriers are used for generating PWM pulses, it is difficult to implement the technique mentioned in the prior applications by using only a general purpose microcontroller. Thus, an external circuit and a digital integrated circuit such as a FPGA (Field-Programmable Gate Array) or a DSP (Digital Signal Processor) are additionally required, which may cause increase of cost and size.

Also, in the technique disclosed in Non-Patent Document 3, because PWM pulses are generated by the space vector control method, a calculation process becomes complex. Thus, it is also difficult to implement the technique by using a general purpose microcontroller.

Further, the PWM control method mentioned in Non-Patent Documents 1 and 3 or the prior applications is based on what is called two-phase modulation. In the conventional two-phase modulation which has been known from the past, electrical current continuously flows through a switching element which is fixed to an on state. Thus, for example, the following problems arise depending on a condition such as an output frequency of an inverter:
1) a specific switching element is overheated, 2) noise increases because the number of switching decreases as compared to a three-phase modulation, 3) when performing the two-phase modulation, the respective output voltage command values of respective phases suddenly change. Thus, electrical disturbance occurs.

Thus, according to the above mentioned conventional techniques or prior applications, a ripple current component of a capacitor can be reduced if a complexity of calculation process and increase of cost because of employment of a high-cost arithmetic operating device are acceptable. However, considering versatility or economy, the above mentioned conventional techniques or prior applications are not satisfactory.

RELATED-ART DOCUMENTS

Patent Document

[Patent Document 1] Japanese Laid-Open Patent Publication No. 2013-183636 (FIG. 3 etc.)

Non-Patent Document

[Non-Patent Document 1] Institute of Electrical Engineers of Japan, Semiconductor Power Conversion Circuit, 8th edition, pp. 124-125, May 25, 1995

[Non-Patent Document 2] Kimura et al., "High-power-density Inverter Technology for Hybrid and Electric Vehicle Applications", Hitachi Review, VOL. 95, No. 11, pp. 754-755, November 2013

[Non-Patent Document 3] Nishizawa et al., "Space Vector Modulation to Reduce Input Current Harmonics of two-level VSI Corresponding to the Power Factor Change", Proceedings of Joint Technical Meeting on Semiconductor Power Conversion/Motor Drive, Institute of Electrical Engineers of Japan, Hokkaido Branch, SPC-15-133, Aug. 28, 2015.

SUMMARY OF THE INVENTION

Therefore, an object of the present invention is to provide a control method of an inverter, a control device, and an inverter capable of reducing a ripple current component of a capacitor and preventing heat generation of a capacitor while maintaining a target output voltage, and further capable of reducing cost of an entire system, by controlling an inverter by modified PWM pulses generated by a general purpose microcontroller, which are different in a generation timing and a generation frequency from conventional PWM pulses.

To solve the above problems, a control method of an inverter is provided. The inverter to which an embodiment of the present invention is applied includes a plurality of series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of polyphase alternate-current (AC) electrical power. In the method, the semiconductor switching elements are controlled by using pulse width modulation (PWM) pulses obtained by comparing output voltage command values of respective phases with a carrier.

The method includes a step of generating modified PWM pulses of respective phases based on an output of a counter common to the respective phases, and a step of controlling the semiconductor switching elements by using the modified PWM pulses. Each of the modified PWM pulses is configured such that a total pulse width, in a period corresponding to one or more cycles of the carrier, is substantially equal to a total pulse width of an assumed PWM pulse of a corresponding phase among the respective phases, the assumed PWM pulse being obtained by comparing, with the carrier, a time average value of an output voltage of the corresponding phase in the period, and at least one of a generation timing and a generation frequency of at least one of the modified PWM pulses is changed from the assumed PWM pulse, exceeding a necessary extent for control.

BRIEF DESCRIPTION OF THE DRAWINGS

FIGS. 1A and 1B are diagrams illustrating a concept of generating an output voltage pulse corresponding to one phase of a three-phase inverter, and a relation between an output voltage command value, an output voltage, a carrier, and the like;

FIG. 2 is an operation waveform diagram illustrating Example 1 in a second embodiment;

DETAILED DESCRIPTION OF THE PREFERRED EMBODIMENTS

In the following, a first embodiment will be described.

Generally, a first harmonic component of an AC voltage and an AC current of an AC side of an inverter are determined depending on a state of an AC output side (load) of the inverter, and based on the AC voltage and the AC current, effective power of the AC side of the inverter is also determined. Conversely, a DC voltage of the inverter is basically maintained to be a predetermined value, though it may sometimes vary. Effective power of a DC side of an inverter corresponds to a sum of effective power of the AC side of the inverter and a loss of the inverter. However, because the loss of the inverter should preferably be smaller and is not configurable value, the effective power of the DC side of the inverter (a product of a DC voltage and a DC current component of the DC side) is substantially determined by an operation state of the AC side.

A ripple current component of the DC side of the inverter varies in accordance with an output method of an output pulse of the inverter (in other words, a pulse pattern of output voltage), under a constraint that the ripple current component is determined by the operation state of the AC side.

That is, reducing a ripple current component of the DC side (which is a ripple current component of a capacitor) is equivalent to generating an output voltage pulse such that the ripple current is minimized, under a constraint of voltage and a first harmonic component of the AC side determined by the operation state of the AC side.

Figure 20:
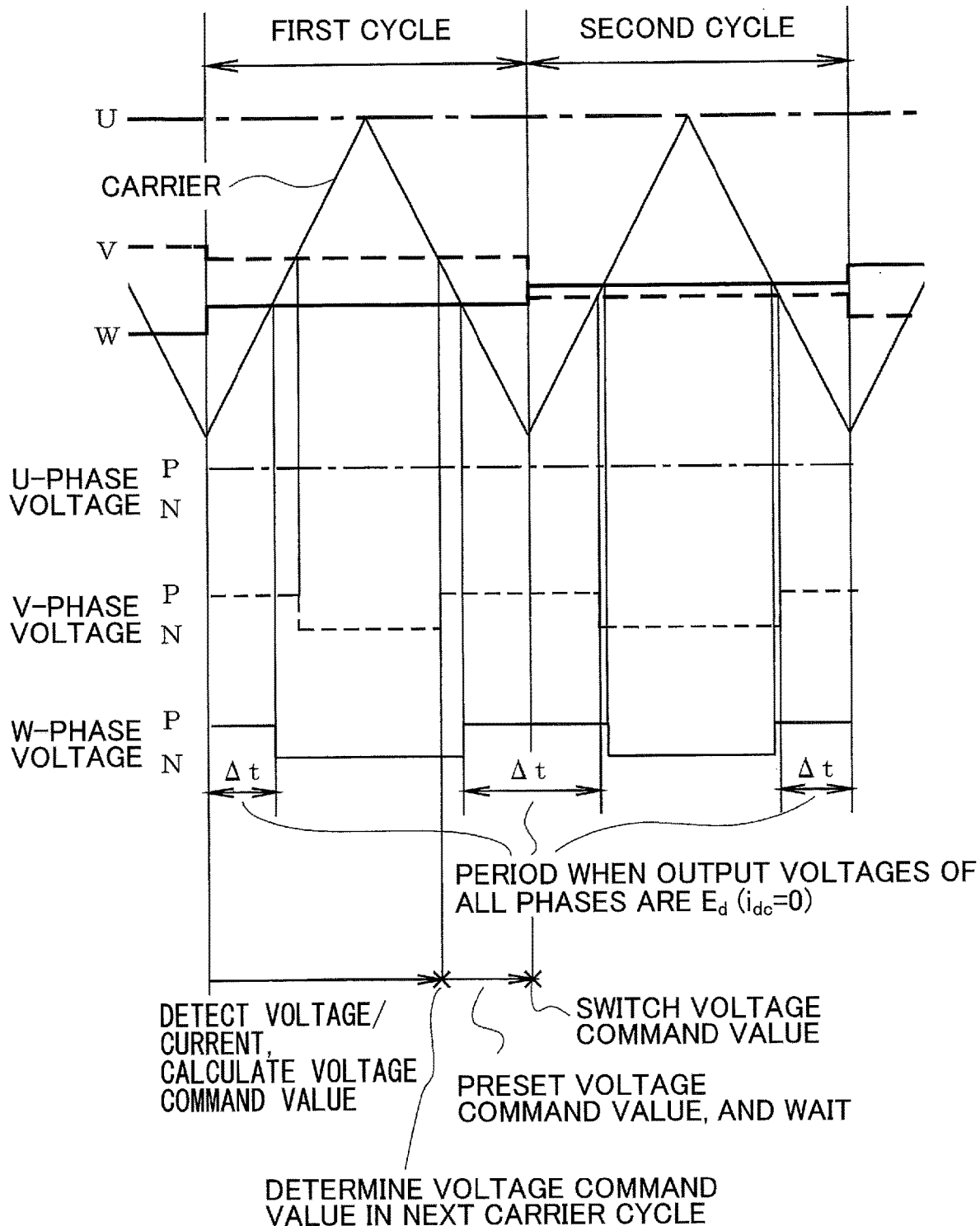
FIG. 20 illustrates another operation waveform diagram when performing a conventional two-phase modulation using a triangle wave as a carrier.
Figure 21:
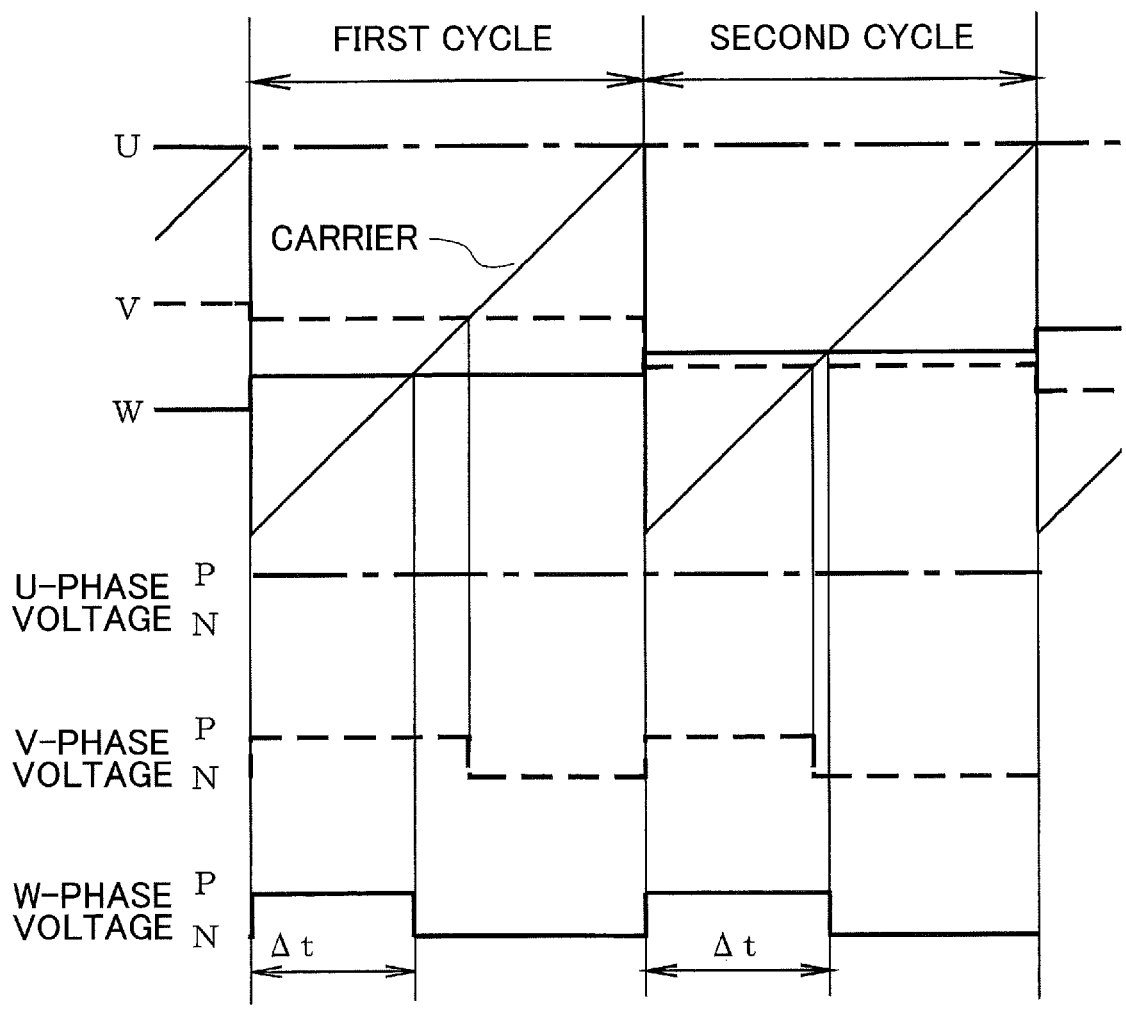
FIG. 21 illustrates an operation waveform diagram when performing a conventional two-phase modulation using a sawtooth wave as a carrier.
Figure 22:
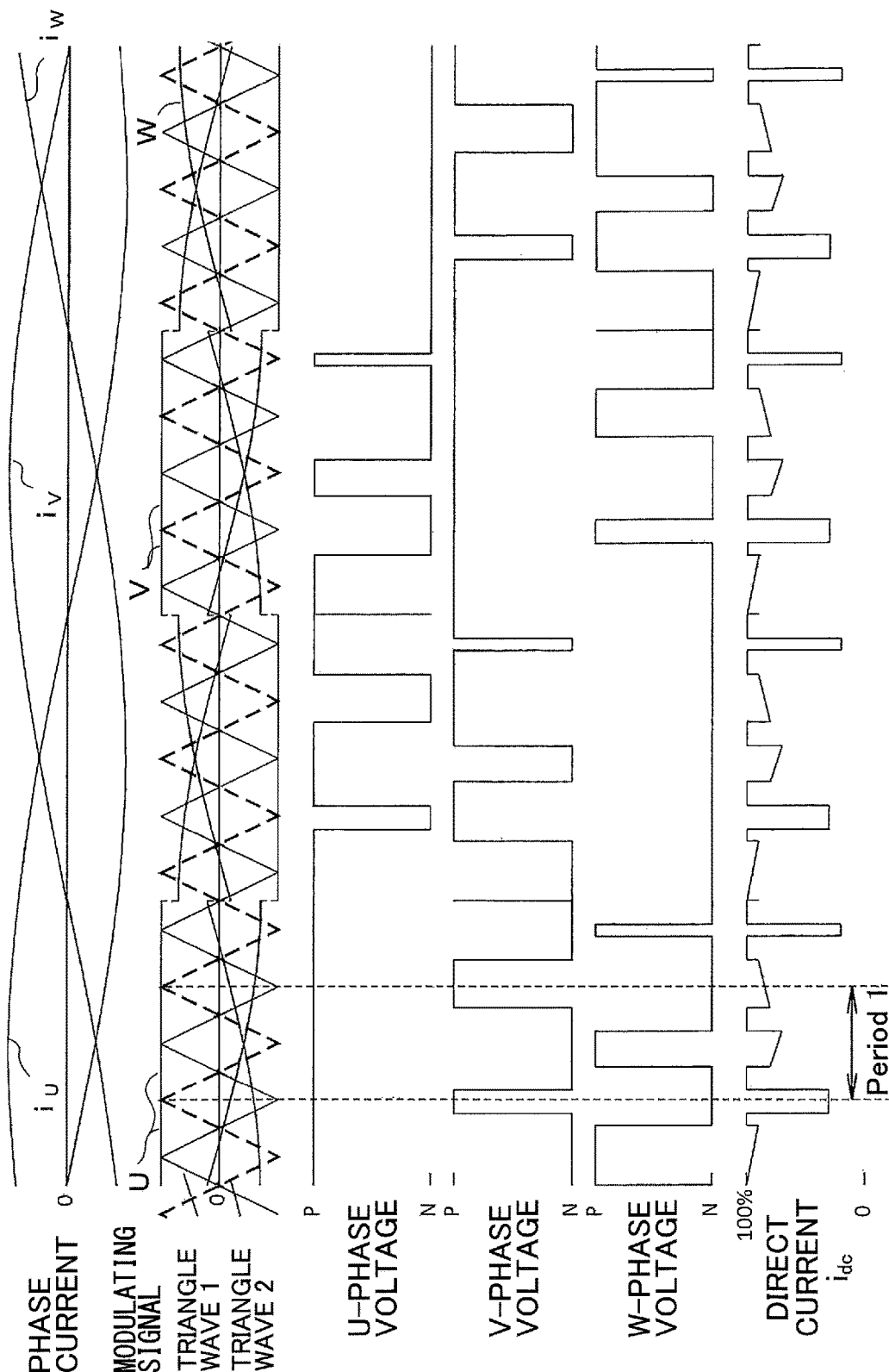
FIG. 22 illustrates an operation waveform diagram when performing a two-phase modulation in prior applications, by using triangle waves as a first carrier and a second carrier.

In PWM control, in principle, a width of a PWM pulse (a width of a switching pulse) to a carrier cycle (switching cycle) which is for example a first cycle or a second cycle illustrated in FIG. 20 or 21 is proportional to an average of an AC side voltage of an inverter in the corresponding carrier cycle. Thus, if a generation timing of a PWM pulse (leading edge and trailing edge of pulses) and a generation frequency of the PWM pulse are changed while maintaining a width of a PWM pulse to be a target value in the corresponding carrier cycle, a ripple current component flowing through a capacitor in a DC side of the inverter can be reduced while maintaining (an average of) AC side voltage output by the inverter, and heat generation of the capacitor can be suppressed.

Further, the generation timing and the generation frequency of the PWM pulse may be adjusted in a period of two or more carrier cycles while maintaining a width of a PWM pulse to be a target value in the corresponding carrier cycles. In this case, the degree of freedom of the adjusting becomes higher.

Note that the above described method is applicable to both two-phase modulation and three-phase modulation, and the number of phases of an inverter is not limited to three-phases.

Figure 1A:
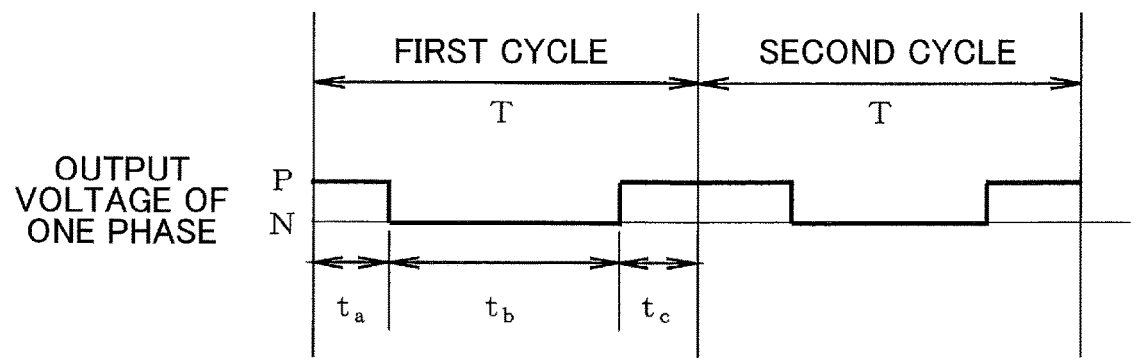
Figure 1B:
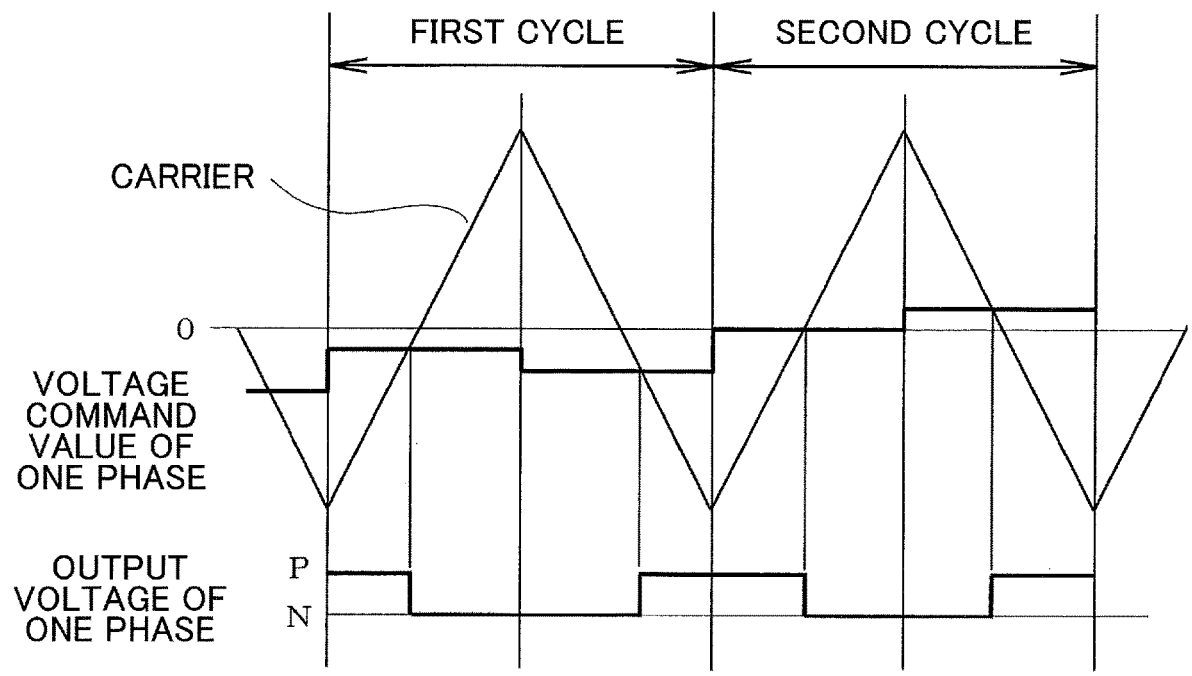

FIGS. 1A and 1B are diagrams illustrating a concept of generating an output voltage pulse corresponding to one phase of a three-phase inverter, and a relation between a voltage command value, an output voltage, a carrier, and the like.

As illustrated in FIG. 1A, within one carrier cycle T, the following operations are repeated sequentially:

Term $t_a$: By turning on a switching element of an upper arm of one phase, and turning off a switching element of a lower arm of the phase, voltage of the positive electrode P of the DC voltage source B is output (let the voltage be $V_P$).

Term $t_b$: By turning on the switching element of the lower arm of the phase, and turning off the switching element of the upper arm of the phase, voltage of the negative electrode N (0 [V]) of the DC voltage source B is output.

Term $t_c$: Similar to the term $t_a$, the voltage of the positive electrode P is output again.

As is well known, an average voltage $V_{ave}$ of an AC side of the inverter in the carrier cycle T is expressed as:

$$V_{ave}=V_P \times \Sigma(T_P)/T$$

Note that $V_P$ is voltage of the positive electrode P as described above, and that $\Sigma(T_P)$ is a sum of time when $V_P$ is output in the cycle T. In FIG. 1A, an equation of $\Sigma(T_P)=t_a+t_c$ is established.

The PWM control utilizes the above formula. That is, the average voltage $V_{ave}$ to be output to the AC side of the inverter in the carrier cycle T is controlled by adjusting a pulse width (note that the pulse width means a sum of ON periods of the PWM pulse; in other words, a sum of periods when $V_p$ is output).

Note that the adjustment of the pulse width may be performed based on an average voltage in multiple cycles (for example, two cycles). That is, the pulse width may be adjusted based on the following formula:

$$V_{ave}=V_P \times \Sigma(T_P)/2T$$

Even when magnitude of a carrier cycle varies, by setting the magnitude of the carrier cycle to a denominator of the above formula, $\Sigma(T_P)$ with respect to a target average voltage $V_{ave}$ can be calculated.

As described above, a main point for outputting a desired AC voltage in a three-phase inverter is nothing other than controlling a sum of a pulse width in a given period. Also, as is apparent from the above formula, a time when a voltage pulse (PWM pulse) occurs in a carrier cycle does not affect the average voltage $V_{ave}$.

That is, this is a degree of freedom for realizing the present invention, and the point of the present invention is to reduce a ripple current component of a capacitor by appropriately adjusting a generation timing and a generation frequency of a pulse.

As is apparent from the above description, a sum of a pulse width and an output timing of a pulse are both a matter of time management in switching. As digital control is the mainstream of a control method of today's inverters, a counting means (that is, a counter (timer)) is certainly required when the time management (when and how long a pulse is to be output) is performed.

For example, in a carrier comparing method comparing a triangle wave as a carrier with a voltage command value, the triangle wave is generated by periodically incrementing and decrementing a counter, a value of the triangle wave is compared with the voltage command value, and a pulse is switched when a magnitude relation of the triangle wave and the voltage command value has been inverted. Also, in the space vector control method disclosed in Non-Patent Document 3, a period of time when a voltage vector is output is controlled based on a counter.

In the prior applications, the carrier comparing method is used for the PWM control. As two types of carrier waves being inverted in phase from each other are used in the prior applications, two counters are required. In a typical carrier comparing method, as a carrier wave common to each phase is used, only a single counter is required.

When a general purpose microcontroller that is generally distributed is used for an inverter, the inverter is generally designed such that a single counter is used. That is, a counter used for generating PWM pulses is common to each phase. Accordingly, it is difficult to implement the technique in the prior applications by using a general purpose microcontroller, and an external circuit needs to be provided to implement the technique in the prior applications.

Further, in the space vector control method disclosed in Non-Patent Document 3, voltage vectors to be output are chosen for each sector of a voltage phase angle (a size of a sector is 60°, for example), and a timing and a period when the chosen voltage vectors are to be output are determined. A counter is used to realize the control. As the choice of the voltage vectors varies depending on the voltage phase angle, a counter is not common to each phase. Normally, to realize the above mentioned control, in addition to a microcontroller, an FPGA for performing other digital signal processing, or a DSP for high-speed signal processing is required. Thus, a complexity of a calculation process and increase of cost are unavoidable.

That is, it is difficult to implement the technique disclosed in Non-Patent Document 3 by only a general purpose microcontroller using a single counter common to each phase.

On the other hand, in the present invention, by comparing a voltage command value of each phase with a single carrier generated by a single counting means that is common to each phase, modified PWM pulses, whose generation timings and generation frequencies are different from PWM pulses generated by a conventional carrier comparing method, are generated. Thus, as compared to the prior applications or Non-Patent Document 3, this invention can conveniently reduce a ripple current component of a capacitor while outputting desired voltage. Typical examples of a carrier include a triangle wave and a sawtooth wave, and one of the typical carriers may be output by means of the counting means.

Further, in a case in which a finer control is to be performed because of a necessity of controlling the AC side or the like, a command value may be changed in a shorter cycle by shortening an adjusting cycle of an AC voltage, such as ½ carrier cycle. In a case in which a triangle wave is used as a carrier, a switching of one phase is performed in an ascending period of the triangle wave and a descending period of the triangle wave (that is, the switching is performed twice per carrier cycle).

Accordingly, as illustrated in FIG. 1B, by updating a voltage command value of one phase at points corresponding to apexes at a top or bottom of the triangle wave, a result of the update can be reflected in a timing of a pulse.

However, as a rule, because an update cycle of pulse timing is much smaller than a time constant of control in the AC side, an amount of variation of a command value for each ½ cycle of a carrier becomes small when such a control is performed. Especially, when the AC side is in steady state, only a value corresponding to an amount of variation of an original wave of an AC voltage in accordance with change of a phase angle theoretically occurs as variation of a command value. That is, the PWM pulse in this case does not differ from a PWM pulse generated by comparing an average voltage within a carrier cycle with a triangle wave such that a significant difference occurs between loss (heat generation) of a capacitor occurring by a ripple current component caused by switching in accordance with the respective PWM pulses.

On the other hand, in the present invention, by changing a generation timing and a generation frequency of a PWM pulse exceeding a necessary extent for control, a ripple current component can be reduced. Therefore, with respect to loss produced by a capacitor, a significant difference occurs in the present invention.

From the perspective of an upper limit of temperature of a capacitor, alleviating rise of temperature caused by heat generation in the capacitor is an important problem. For example, although an upper temperature limit of a film capacitor employing polypropylene is approximately 105° C., temperature during operation may reach 100° C. at maximum. Thus, if the temperature can be decreased even by a small amount (2 to 3° C., for example), the decrease is of significant effect. Further, as the present invention is suitable for being implemented by software, the present invention is advantageous in that additional hardware cost is zero or little.

Figure 7:
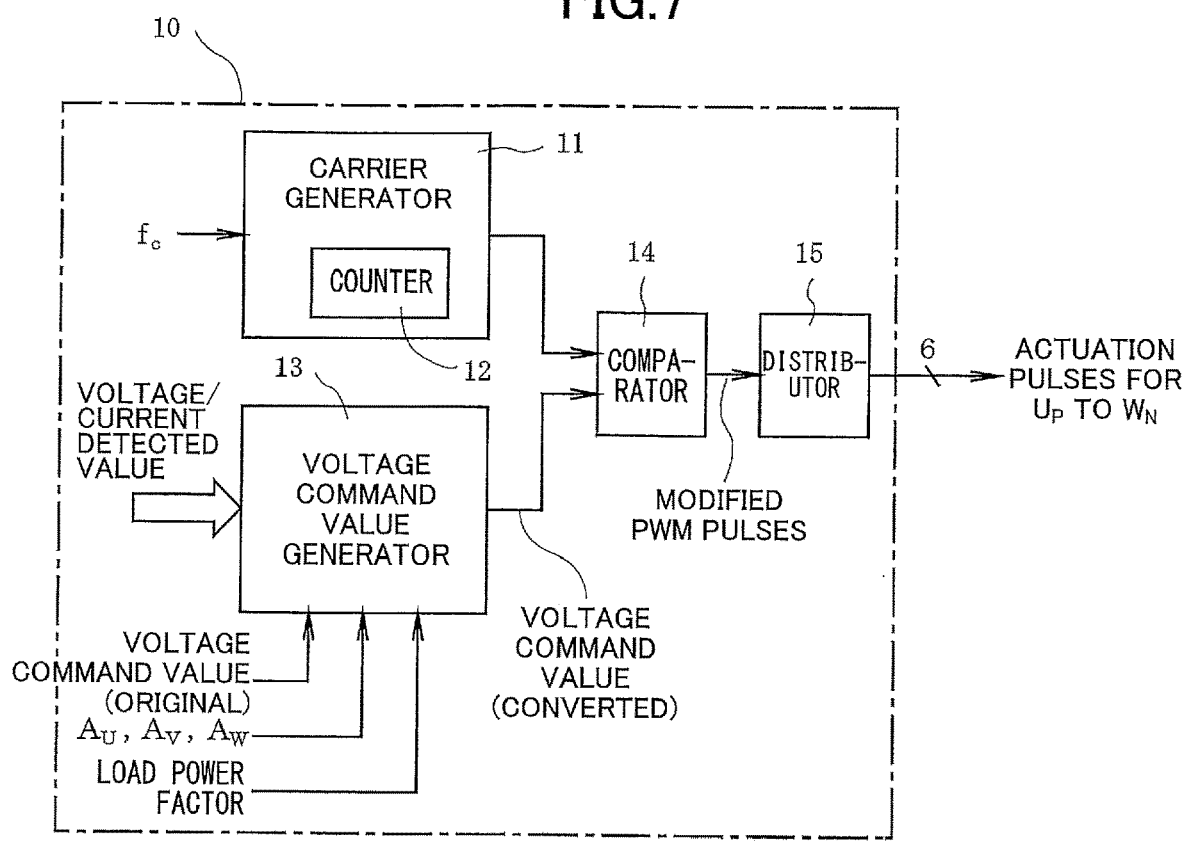
FIG. 7 is a functional block diagram of a control device of an inverter according to the first to third embodiments.

FIG. 7 is a functional block diagram of the control device of the inverter according to the first embodiment, and the inverter according to a second embodiment and a third embodiment to be described below.

Each function of the control device 10 is embodied by hardware included in a general purpose microcontroller and software installed in the hardware. In FIG. 7, an element 11 is a carrier generator for generating a triangle wave or a sawtooth wave as a carrier common to each phase, by operating a single counter 12 based on a carrier frequency $f_c$, an element 13 is a voltage command value generator for calculating a voltage command value of each phase, by receiving detected voltage and detected current, an element 14 is a comparator for generating modified PWM pulses by comparing the carrier with a voltage command value of each phase, and an element 15 is a distributer for generating actuation pulses for every switching element $U_P$ to $W_N$, based on the modified PWM pulses.

Note that a ratio $A_U$, $A_V$, and $A_W$, and a load power factor, which are input to the voltage command value generator 13, will be explained in the third embodiment to be described below.

Next, as more concrete forms of the first embodiment, the second embodiment and the third embodiment for controlling an inverter using the modified PWM pulses will be described.

Figure 18:
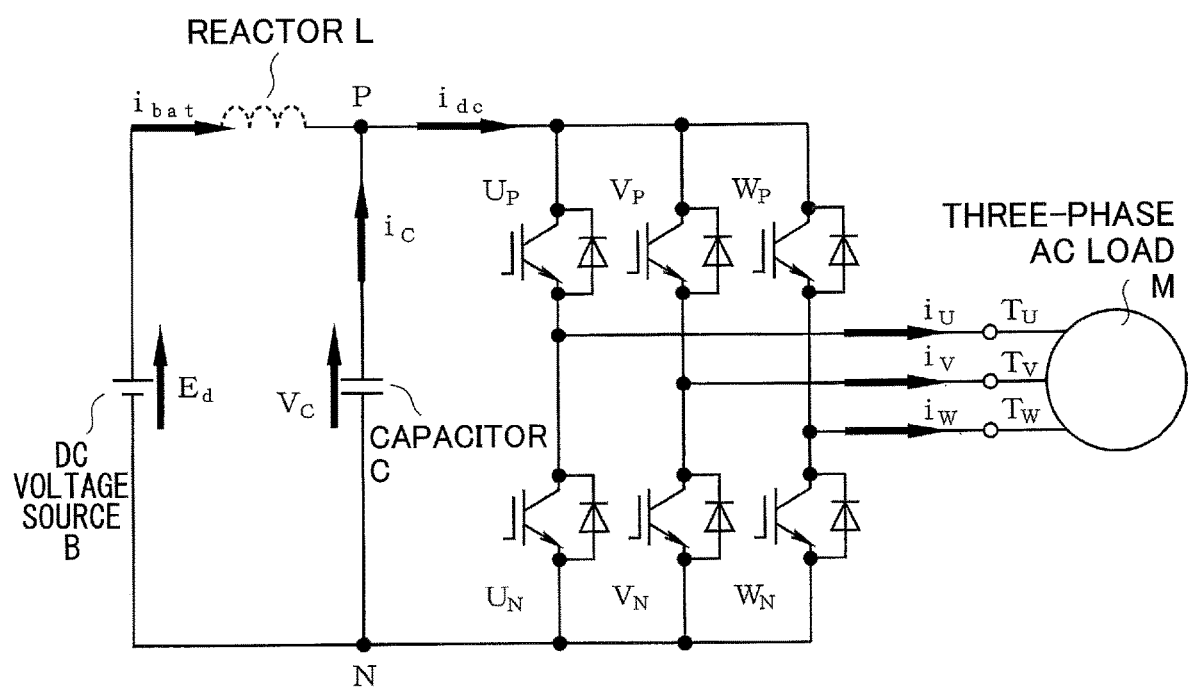
FIG. 18 is a diagram illustrating a configuration of a main circuit of the three-phase inverter.

The examples to be described below are targeted to the three-phase inverter as illustrated in FIG. 18, having the DC voltage source B, the capacitor C, the switching elements $U_P$, $V_P$, $W_P$, $U_N$, $V_N$, and $W_N$, and the like, which is PWM controlled by comparing a carrier with an output voltage command value of each phase.

In the second embodiment, original output voltage command values of modulation phases (hereinafter, the output voltage command value is simply referred to as a voltage command value) are converted in accordance with a predetermined conversion rule, and, by actuating the switching elements in accordance with modified PWM pulses obtained by comparing the converted voltage command values with a single carrier, the second embodiment shortens a period while $i_{dc}$ is zero, and thereby decreases a ripple current component of the capacitor C.

Figure 19:
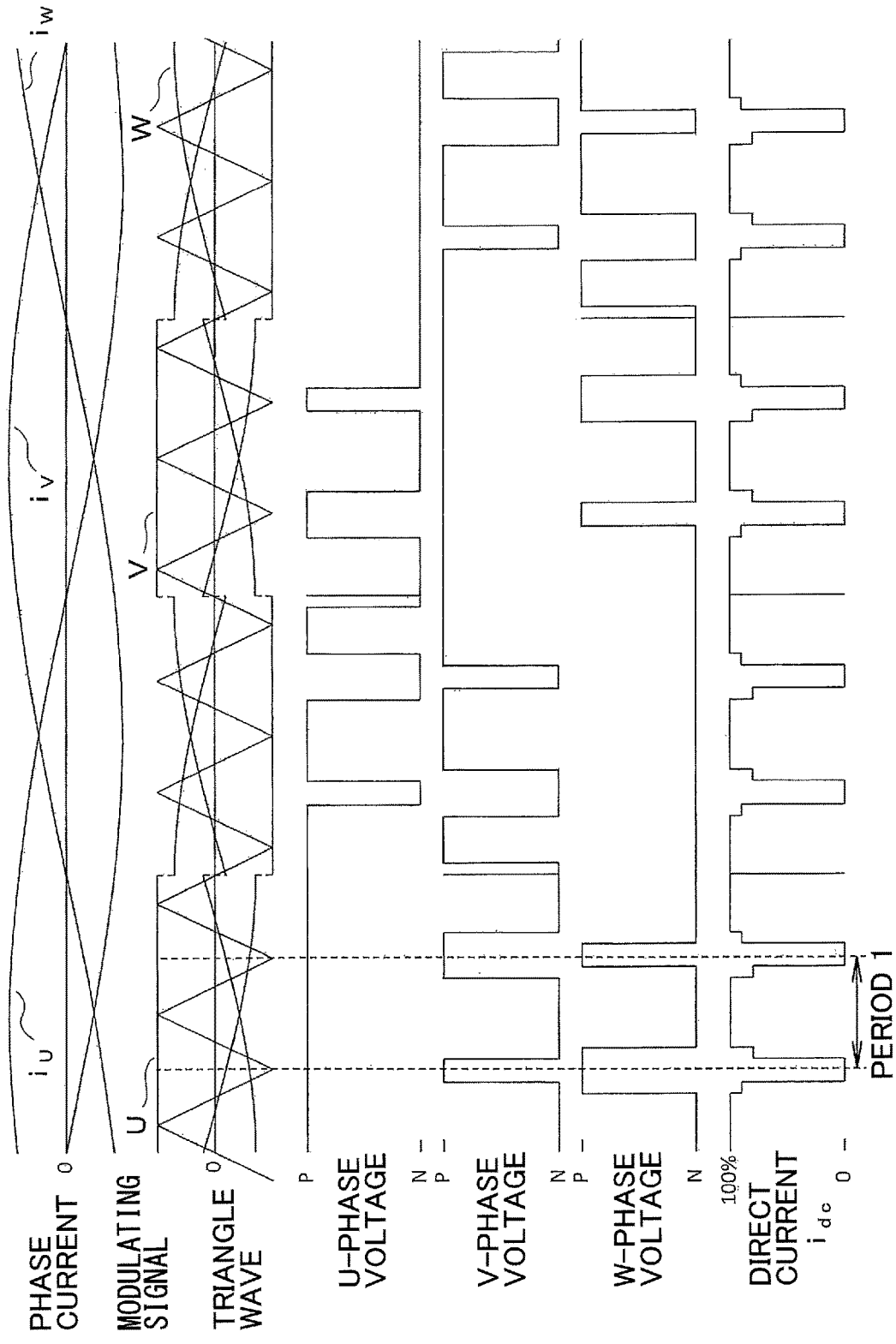
FIG. 19 illustrates an operation waveform diagram when performing a conventional two-phase modulation using a triangle wave as a carrier.

That is, in the second embodiment, instead of the conventional two-phase modulation as illustrated in FIG. 19 or FIG. 20 (a modulation method in which an on/off state of switching elements for one phase is fixed for a certain period of time, and in which on/off states of switching elements for other phases are controlled), a new method for reducing a ripple current component (which is referred to as a modified two-phase modulation, for convenience) is used, in which the output voltage command values of the two phases (corresponding to the modulation phases) are converted in accordance with a predetermined conversion rule, and on/off control of the switching elements is performed in accordance with the modified PWM obtained by comparing the converted voltage command values with a single carrier.

Example 1

FIG. 2 is a diagram illustrating a first example (Example 1) in the second embodiment. As illustrated in FIG. 2, during a first cycle and a second cycle of the carrier, the output voltage command value of the U-phase is fixed, and the V-phase and W-phase act as modulation phases. A chart (a) in FIG. 2 illustrates, for comparison, a carrier and voltage command values U, V, and W of respective phases, which are the same waveforms as the waveforms of the carrier and the voltage command values U, V, and W illustrated in FIG. 20.

In Example 1, the voltage command values U, V, and W of the chart (a) in FIG. 2 are respectively converted into voltage command values U (U is not converted), $V_t$, and $W_t$ of a chart (b) in FIG. 2, in accordance with a conversion rule to be described below.

Figure 3:
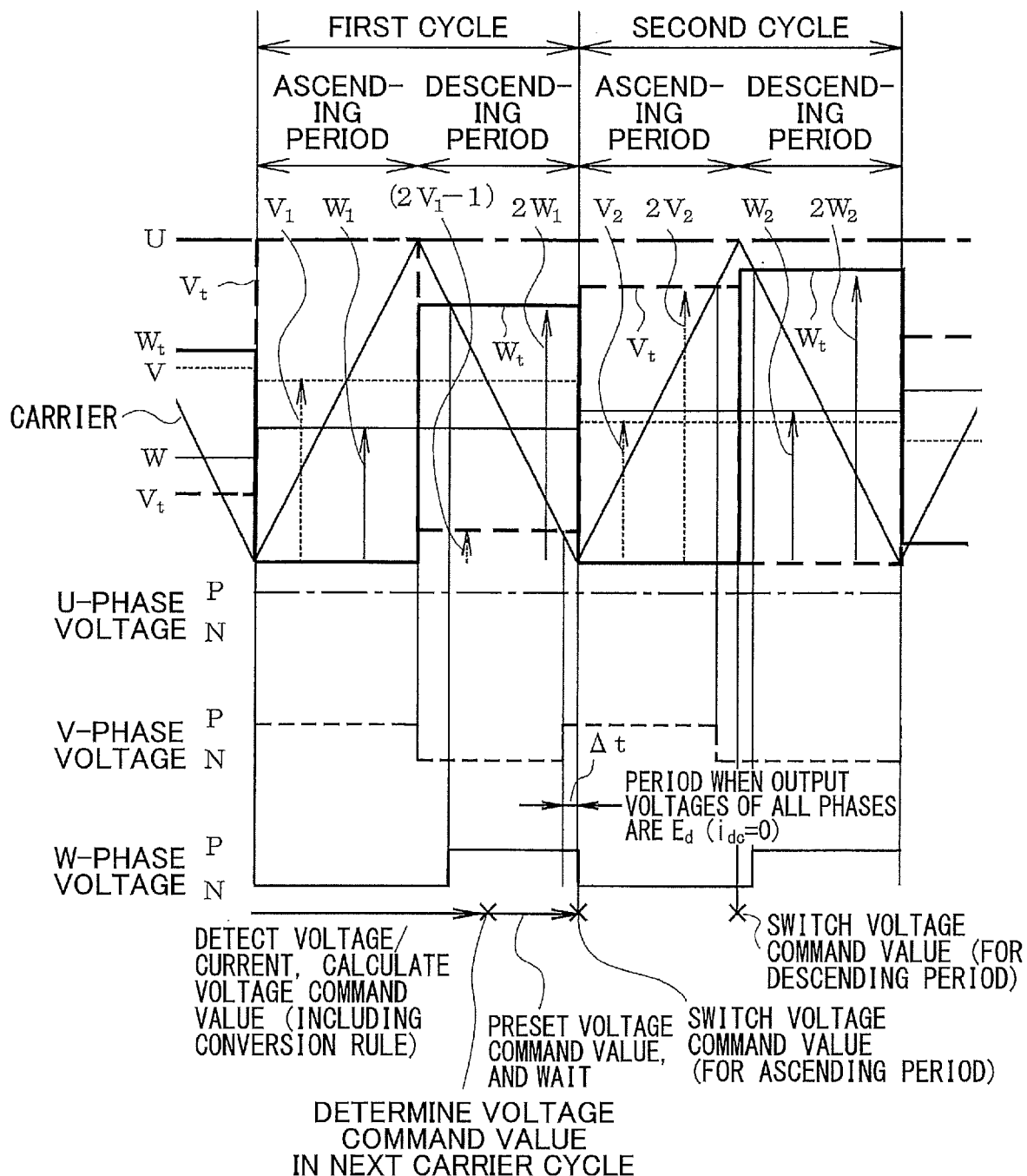
FIG. 3 is another operation waveform diagram illustrating Example 1 in the second embodiment.

The conversion rule for converting into the voltage command values $V_t$, and $W_t$ will be described with reference to FIG. 3. A carrier and voltage command values U, $V_t$, and $W_t$ illustrated in FIG. 3 are the same as those illustrated in the chart (b) in FIG. 2.

With respect to a triangle wave as a carrier, let a value of a crest of the triangle wave (an apex at which a gradient of the triangle wave is changed from positive to negative) be "1", and let a value of a bottom of the triangle wave (a point at which a gradient of the triangle wave is changed from negative to positive) be "0". The voltage command values $V_t$, and $W_t$ corresponding to a period of an ascending half cycle (may also be referred to as an "ascending period") are generated based on formulas 1, and the voltage command values $V_t$, and $W_t$ corresponding to a period of a descending half cycle (may also be referred to as an "descending period") are generated based on formulas 2. As described above, the voltage command value U remain unchanged.

$$\begin{cases} V_t = 2V & (\text{if } 2V < 1) \\ V_t = 1 & (\text{if } 2V \geq 1) \end{cases}$$ (formula 1)
$$\begin{cases} W_t = 0 & (\text{if } 2W < 1) \\ W_t = 2W - 1 & (\text{if } 2W \geq 1) \end{cases}$$

$$\begin{cases} V_t = 0 & (\text{if } 2V < 1) \\ V_t = 2V - 1 & (\text{if } 2V \geq 1) \end{cases}$$ (formula 2)
$$\begin{cases} W_t = 2W & (\text{if } 2W < 1) \\ W_t = 1 & (\text{if } 2W \geq 1) \end{cases}$$

In FIG. 3, $V_1$, and $W_1$ represent magnitude of the voltage command values V and W in the first cycle respectively, and $V_2$, and $W_2$ represent magnitude of the voltage command values V and W in the second cycle respectively.

When magnitude of the converted voltage command values $V_t$, and $W_t$ is expressed by using $V_1$, $W_1$, $V_2$, and $W_2$, in the first cycle, $V_t$ and $W_t$ are expressed as "$V_t=1$, $W_t=0$" during the ascending half cycle of the carrier, and $V_t$ and $W_t$ are expressed as "$V_t=(2V_1-1)$, $W_t=2W_1$" during the descending half cycle of the carrier. Also, in the second cycle, $V_t$ and $W_t$ are expressed as "$V_t=2V_2$ and $W_t=0$" during the ascending half cycle of the carrier, and $V_t$ and $W_t$ are expressed as "$V_t=0$ and $W_t=2 W_2$" during the descending half cycle of the carrier.

The above described conversion rule for converting into the voltage command values $V_t$, and $W_t$ is, in other words, as follows:

In general, regarding phases other than a first phase (U-Phase) whose output voltage is fixed to a voltage of the positive electrode P or the negative electrode N (that is, the phases are a second phase and a third phase (corresponding to V-phase and W-phase in Example 1)), a voltage command value of one phase is output during an ascending half cycle, and a voltage command value of another phase is output during a descending half cycle. By a period for outputting a voltage command value of each of the two phases being separated, a period when AC output terminals of all three phases are connected to the positive electrode P or the negative electrode N simultaneously (a period when $i_{dc}$ is zero) is eliminated to the extent possible. Therefore, a ripple current component of the capacitor C $i_C$ is reduced because a rate of change of DC current $i_{dc}$ is lessened.

Also, magnitude of the converted voltage command value is set to twice as much as magnitude of an original voltage command value x (which represents a voltage command value of V-phase or W-phase), so that a total width of a PWM pulse generated in accordance with the converted voltage command value becomes equal to a total width of a PWM pulse generated in accordance with the original voltage command value x, in order that output voltage does not vary.

In the example illustrated in FIG. 3, magnitude of $W_t$ during a descending half cycle in a first cycle is set to $2W_1$, magnitude of $V_t$ during an ascending half cycle in a second cycle is set to $2V_2$, and the magnitude of $W_t$ during a descending half cycle in the second cycle is set to $2W_2$.

However, in a case in which the magnitude of the converted voltage command value is set to twice as much as magnitude of the original voltage command value, if the magnitude of the converted voltage command value exceeds a value of a crest of the carrier (that is, "1"), modulation cannot be performed correctly. Thus, if the double of the original voltage command value exceeds the value of the crest "1", a portion of the double of the original voltage command value that exceeds "1", which is (2x−1), is set to the voltage command value during the ascending or descending half cycle.

In the example illustrated in FIG. 3, the magnitude of $V_t$ during the descending half cycle in a first cycle is set to $(2V_1-1)$.

Next, a reason that a width of a PWM pulse obtained by comparing a voltage command value with a carrier becomes the same in both cases in which the modified two-phase modulation in Example 1 using the above mentioned converted voltage command value is performed, and in which the conventional two-phase modulation in FIG. 20 using the original converted voltage command value is performed, will be described.

Let an original voltage command value be x (0≤x≤1), a carrier cycle be T, and an amplitude of the carrier (a crest value) be 0 to 1. In this case, a width of a PWM pulse in the conventional two-phase modulation is xT, and a width of a PWM pulse $T_t$ in the modified two-phase modulation is expressed as the following formula 3.

$$\begin{cases} T_t = 2x \times (T/2) + 0 \times (T/2) = xT & \text{(if } 2x < 1\text{)} \\ T_t = 1 \times (T/2) + (2x - 1) \times (T/2) = (T/2) + xT - (T/2) = xT & \text{(if } 2x \geq 1\text{)} \end{cases} \quad \text{(formula 3)}$$

That is, in both the conventional two-phase modulation and the modified two-phase modulation, the width of the PWM pulse becomes xT.

To implement the control method of an inverter according to Example 1 by using a digital control device, as illustrated in FIG. 3, in a first cycle of a carrier, determination of a new voltage command value for the next cycle is made by performing detection of voltage and current of each phase and by performing a calculation of a voltage command value. Thereafter, after a preset of the determined voltage command value is performed and a certain period of wait time elapses, the voltage command value may be updated to the new voltage command value at a time when an ascending half cycle of a second cycle is started (at a bottom of the carrier) and at a time when a descending half cycle of the second cycle is started (at a crest of the carrier).

In the two-phase modulation, when a cycle of a voltage command value is divided into 6 sectors each corresponding to a time period of an electrical angle of 60°, a phase (first phase) whose output voltage is fixed to voltage of the positive electrode P or voltage of the negative electrode N is changed for each sector. During a certain sector (of 60° electrical angle), if the output voltage of the first phase is fixed to voltage of the positive electrode P or negative electrode N, PWM pulses for the other phases (second phase and third phase) are generated by comparing new voltage command values of the second and third phases with a carrier.

As the above mentioned operation is regularly repeated for each 60° electrical angle, if the operation in a single time period of an electrical angle of 60° is determined, an operation in one cycle of a voltage command value is also determined. Therefore, in the present embodiment, a case, in which the U-phase is fixed to voltage of the positive electrode P and in which the V-phase and W-phase are modulation phases, is only described.

Also, in a case in which the U-phase is fixed to voltage of the negative electrode N and in which the V-phase and W-phase are modulation phases, by equivalently using the above mentioned formulas 1 and 2 in an ascending half cycle and a descending half cycle of a carrier, voltage command values $V_t$ and $W_t$, may be generated.

The above described conversion rule of voltage command values may vary depending on whether a range of a carrier or a voltage command value is set to "0" to "+1", or "−1" to "+1". However, a principle of the conversion rule is that a voltage command value of a modulation phase is set to one of the half cycles of a carrier (either an ascending half cycle or a descending half cycle), and that if the magnitude of the converted voltage command value surpasses a value of a crest, a voltage command value of magnitude corresponding to the surplus is output in another half cycle.

By performing the conversion described above, overlapping the voltage command values of the two modulation phases can be avoided. Specifically, if the magnitude of both the original voltage command values of the two modulation phases is less than "0.5", an overlap of the converted voltage command values does not occur. Conversely, if the magnitude of the original voltage command value of one of the two modulation phases is more than "0.5", an overlap of the converted voltage command values occurs. However, as a period of the overlap may be shorter than that of the conventional two-phase modulation, an effect of reducing a ripple current component contained in the DC current $i_{dc}$ can be expected.

However, as mentioned in the prior applications (Japanese Patent Application No. 2015-166526 and PCT/JP2016/075045), there may be a case in which a ripple current component is reduced by performing the conventional two-phase modulation or a three-phase modulation, depending on a condition. Thus, both the conventional modulation and the modified two-phase modulation in the present embodiment may be used. That is, which modulation is to be used may be chosen based on various conditions.

In Example 1, because a carrier used in the control method according to Example 1 is a single triangle wave, the control method can be implemented by a software processing using hardware constituted by a general purpose microcontroller. Therefore, the control method according to Example 1 is versatile and advantageous from a perspective of cost. Especially, operation cost of the formulas 1 and 2 is quite small, and an operation of setting (presetting) a voltage command value can be realized only by writing the value into a register in a general purpose microcontroller. As software processing load for performing these operations is low, increase of processing workload that may occur by implementing the control method according to Example 1 is negligible.

In Example 1, a case in which a voltage command value is updated at a time when a carrier is changed from a descending period to an ascending period is described. However, a voltage command value may be updated at a time when a carrier is changed from an ascending period to a descending period. This is similar to other examples to be described below.

A basic concept of the above described conversion rule is that voltage command values of the two phases (modulation phases) are configured such that a PWM pulse corresponding to one phase of the modulation phases and another PWM pulse corresponding to another phase of the modulation phases are respectively generated in different half cycles (an ascending half cycle and a descending half cycle) of a triangle wave as possible, and that, if possible, the converted voltage command value for a half cycle in which a PWM pulse is not generated is set to zero.

However, even if the voltage command is not zero, if the original voltage command value is an average voltage in a carrier cycle, and if a voltage command value in an ascending half cycle and a voltage command value in a descending half cycle are set such that a predetermined magnitude relation is made between the voltage command value in the ascending half cycle and the average value, and between the voltage command value in the descending half cycle and the average value, a period when $i_{dc}$ is zero can be reduced as compared to the conventional two-phase modulation.

Example 2

Next, Example 2 in the second embodiment will be described.

Generally, a switching operation causes a steep variation of current and voltage in a main circuit of an inverter, and electromagnetic disturbance is caused because of the steep variation of current and voltage. The electromagnetic disturbance may hinder an accurate detection of current. In a conventional control method, as switching is typically not performed near a crest and a bottom of a carrier, detection of current is performed at a point corresponding to the crest or bottom of the carrier, or close to the crest or bottom of the carrier in most cases. Thus, as illustrated in FIG. 20, if detection of current, a calculation of a command value, and the like are performed during a period including the crest of the carrier, and if switching is performed in a period not including the crest or bottom of the carrier, occurrence of the electromagnetic disturbance can be prevented.

However, in Example 1, as is apparent from FIG. 3, a voltage command value is switched at a point corresponding to a crest and a bottom of a carrier. Also, switching is performed at or near the time when the voltage command value is switched. Thus, if detection of current is performed at or near the time corresponding to the crest and the bottom of the carrier, the detection is likely to be affected by the disturbance caused by the switching.

It is possible to find a period when switching is not performed and to detect current during the period. However, in this case, calculation of a voltage command value cannot be performed at a predetermined timing. Thus, there are concerns about a shortage of an operation time for calculating a voltage command value, or occurrence of instability of a control system.

In Example 2, a method is proposed in which a voltage command value is controlled such that switching is not performed at a point corresponding to an apex of a carrier, in order to be capable of detecting current at timing when disturbance caused by the switching does not affect the detection of current.

Figure 4:
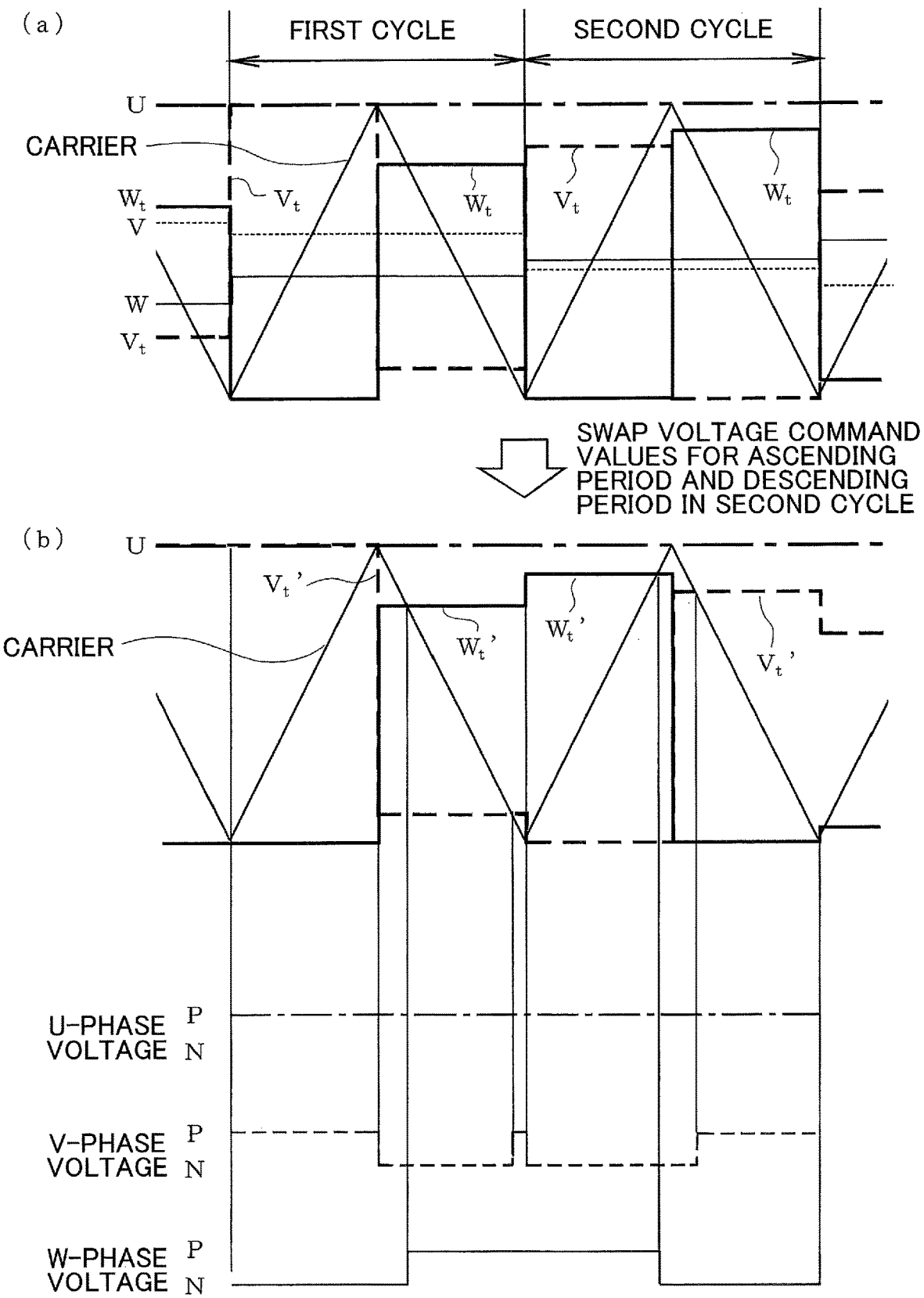
FIG. 4 is an operation waveform diagram illustrating Example 2 in the second embodiment.

FIG. 4 is a diagram for describing an operation according to Example 2. A chart (a) in FIG. 4 illustrates, for comparison, a carrier and voltage command values of respective phases, which is the same as a diagram illustrated in an upper portion of FIG. 3.

In Example 2, as illustrated in a chart (b) of FIG. 4, voltage command values $V_t'$ and $W_t'$ in a first cycle are obtained in accordance with the method described in Example 1, and with respect to the voltage command values $V_t'$ and $W_t'$, in a second cycle, $V_t$ of an ascending half cycle of a carrier obtained by the method described in Example 1 is set as $V_t'$ of a descending half cycle, and $W_t$ of the descending half cycle obtained by the method described in Example 1 is set as $W_t'$ of the ascending half cycle. That is, the voltage command value in a second cycle of each phase is obtained by swapping the voltage command value of the ascending cycle and the voltage command value of the descending cycle.

Note that $V_t'$ is zero in the ascending half cycle of the second cycle, and $W_t'$ is zero in the descending half cycle of the second cycle.

According to Example 2, if both of the voltage command values of V-phase and W-phase as modulation phases ($V_t'$ and $W_t'$) are less than 0.5, switching does not occur at a time corresponding to a bottom of the carrier. Accordingly, by detecting current at the time, effect of disturbance caused by the switching can be avoided.

As illustrated in the chart (b) of FIG. 4, in a case in which at least one of the voltage command values is more than 0.5, the switching may occur at the time corresponding to the bottom of the carrier. However, in Example 2, as the number of occurrence of the switching at the time corresponding to the bottom of the carrier is decreased, the effect of disturbance caused by the switching can be significantly reduced.

Example 3

Figure 5:
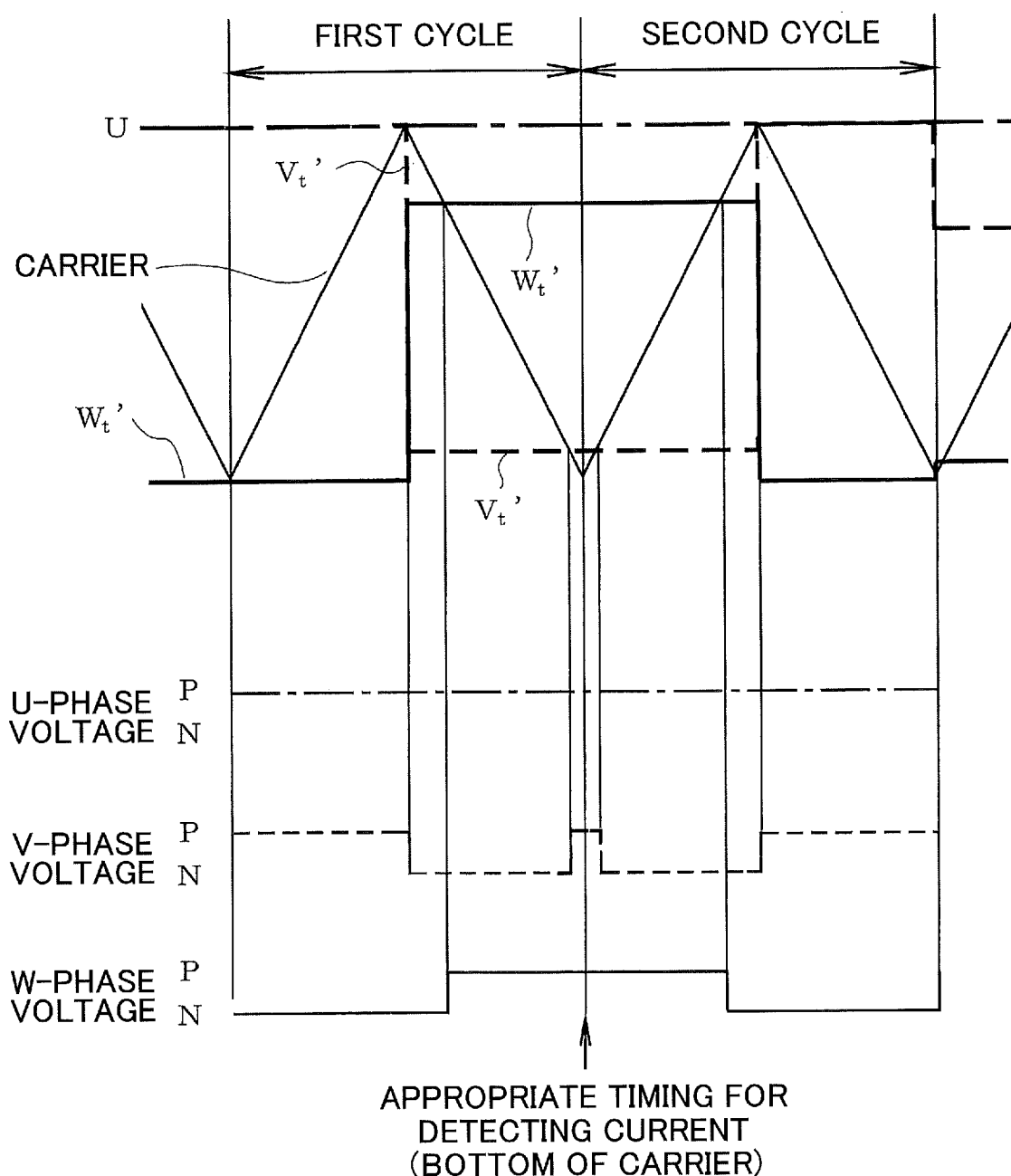
FIG. 5 is an operation waveform diagram illustrating Example 3 in the second embodiment.

Next, Example 3 in the second embodiment will be described. FIG. 5 is a diagram for describing an operation according to Example 3. Note that a conversion method of a voltage command value in a method of Example 3 is the same as that of Example 2.

In the method of Example 2 described above, as illustrated in FIG. 5, if the voltage command value ($W_e'$ for example) does not vary during a time range including a boundary between two adjacent cycles of a carrier, a waveform of the voltage command value becomes symmetrical about a boundary point (bottom of carrier) between a first cycle and a second cycle, and switching does not occur during the time period. Thus, if detection of current is performed during the time period, the detection is not affected by disturbance caused by the switching.

In Example 3, because about one PWM pulse is generated for each two carrier cycles, density of pulses decreases. In other words, it leads to a decrease of a switching frequency of an inverter, and thereby causes an increase of noise caused by switching and an increase of a ripple of AC output current. These problems may similarly occur in Example 2.

The above problems can be alleviated by increasing a carrier frequency. That is, for example, when an original carrier frequency is 8 [kHz], one idea is to set a carrier frequency to 16 [kHz], which is twice the original carrier frequency. In this case, a cycle of control may remain unchanged (8 [kHz]). Detection of current and a calculation of a voltage command value may be performed for each two carrier cycles, and a setting of the voltage command value to be compared with the carrier may be performed four times for the two carrier cycles, at a time of a crest and a bottom of the carrier.

Example 4

Figure 6:
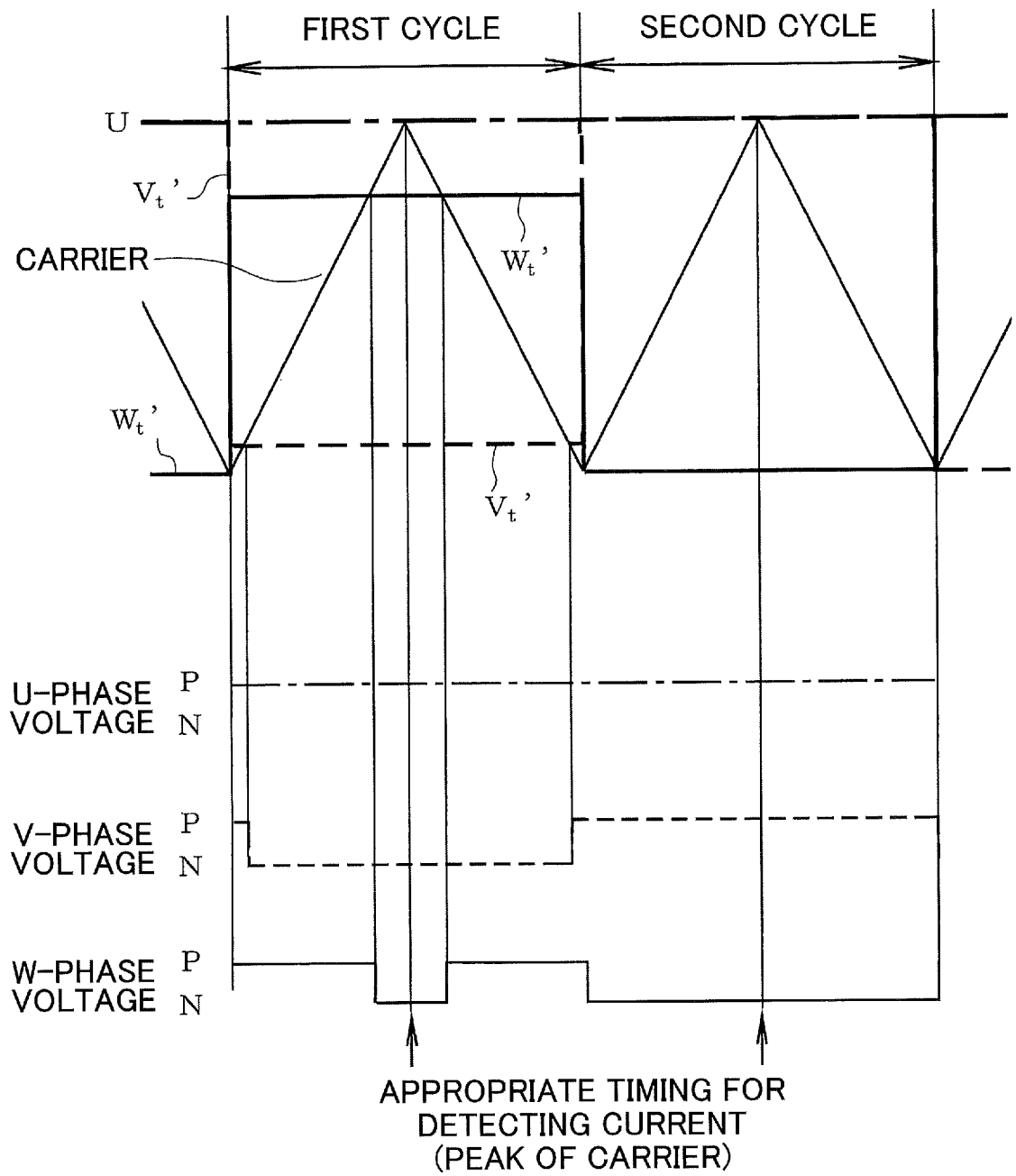
FIG. 6 is an operation waveform diagram illustrating Example 4 in the second embodiment.

Next, Example 4 in the second embodiment will be described. FIG. 6 is a diagram for describing an operation according to Example 4.

In each Example (Example 1, 2, and 3) described above, a voltage command value is changed in an ascending half cycle of a carrier and a descending half cycle of the carrier. Instead, as illustrated in FIG. 6, the voltage command value is changed for each cycle in two consecutive cycles of the carrier. By performing the method, similar effect can be obtained.

Accordingly, as switching does not occur at a time corresponding to a midpoint of a cycle of the carrier, if detection of current is performed at the time, the detection is not affected by disturbance caused by switching.

In this case, as compared with Example 2 or 3, a time suitable for current detection arrives earlier by a half cycle of a carrier. Therefore, a calculation of the voltage command value can be started earlier and a time until the next voltage command value is to be updated can be secured longer. Thus, Example 4 is advantageous in that a margin for the calculation time can be made.

Note that, in order to solve the problems that may occur because of a decrease of the switching frequency, the carrier frequency may be increased, similar to Example 3.

Example 5

In Example 5, a carrier of a waveform other than a symmetrical triangle wave is used.

According to the example illustrated in FIG. 6, since a voltage command value does not vary during a time in the first cycle and during a time in the second cycle, a sawtooth wave or a triangle wave having an ascending gradient and an asymmetrical descending gradient may be used as the carrier. The sawtooth wave mentioned here means a triangle wave as a carrier, in which a timing of a crest within a certain cycle coincides with a timing of a bottom at the next cycle.

In a case in which the sawtooth wave is used as a carrier, the switching is performed at the timing of the crest and bottom. The timing is not necessarily suitable for detecting current, but an effect of reducing a ripple current by reducing a period when DC current $i_{dc}$ is 0 can be achieved similarly to other examples.

A control device of an inverter according to each example in the second embodiment can be realized by the above mentioned functional block diagram in FIG. 7.

That is, in the control device 10 illustrated in FIG. 7, the carrier generator 11 generates a triangle wave by operating the single counter 12, and the comparator 14 compares the triangle wave with a voltage command value of each phase, to generate a modified PWM pulse for each phase. Further, the distributer 15 generates actuation pulses for every switching element $U_P$ to $W_N$, based on the modified PWM pulse.

Next, the third embodiment will be described.

In the second embodiment described above, ripple current component is reduced by using the modified two-phase modulation, but as a PWM control method in the third embodiment, a three-phase modulation is adopted, in which the inverter is controlled by comparing a triangle wave as a carrier with a voltage command value of each phase of a three-phase inverter.

In this case, with respect to voltage command values of at least two phases out of voltage command values of three phases, in a predetermined period and a remaining period within one cycle of the triangle wave (for example, a first half cycle (ascending period) and a second half cycle (descending period) of one cycle of the symmetrical triangle wave as a carrier), the voltage command values of the two phases are determined by increasing or decreasing original voltage command values used for causing a three-phase inverter to output a target voltage in accordance with the conventional three-phase modulation, and the voltage command values of the two phases are configured such that respective average values of the voltage command values of the two phases become equal to the respective original voltage command values of respective phases.

In other words, the voltage command value of a first phase out of at least two phases out of the three phases is set, such that the output voltage in a predetermined period within a cycle of the triangle wave is equal to or more than a time average value of the target voltage, and that the output voltage in the remaining period within the cycle is less than the time average value of the target voltage. Also, the voltage command value of a second phase out of the at least two phases out of the three phases is set, such that the output voltage in the predetermined period within the cycle of the triangle wave is less than the time average value of the target voltage, and that the output voltage in the remaining period within the cycle is not less than the time average value of the target voltage. In addition, the voltage command values are generated such that the voltage command value of the first phase in the cycle of the triangle wave is equal to the time average value of the target voltage of the first phase and the voltage command value of the second phase in the cycle is equal to the time average value of the target voltage of the second phase.

As a result, it is possible to obtain the same output voltage as the conventional three-phase modulation system, while reducing a ripple current flowing through the capacitor and suppressing heat generation of the capacitor, by generating a modified PWM pulse in which the pulse generation timing is shifted by comparing the voltage command value of each phase with the triangle wave, and by using the modified PWM pulse for switching.

Note that a configuration of a main circuit of the three-phase inverter is the same as that illustrated in FIG. 18.

Further, in the following description, it is assumed that a size of the triangle wave is 0 to 1 (0≤triangle wave≤1). Also, the voltage command values of three phases (U-phase, V-phase, and W-phase) of the three-phase inverter are denoted as "$D_X$" (the suffix X is any one of U, V, and W), and let the minimum value and the maximum value of these voltage command values $D_X$ be 0 and 1, respectively.

Example 6

First, Example 6 in the third embodiment will be described.

Let original voltage command values of U-phase, V-phase, and W-phase, which are compared with a triangle wave, be $D_U$, $D_V$, and $D_W$ respectively. The voltage command values $D_U$, $D_V$, and $D_W$ are for causing an inverter main circuit to output three-phase AC voltage of a target voltage.

Also, voltage command values of U-phase, V-phase, and W-phase in Example 6 are defined for each half cycle of the triangle wave. That is, in Example 6, for each of the voltage command values of U-phase, V-phase, and W-phase, the voltage command value of a first half period (ascending period) in one cycle of the triangle wave and voltage command value of a second half period (descending period) in the one cycle of the triangle wave are defined. Further, in a case in which the voltage command value of a half cycle is equal to or more than the original voltage command value, a suffix A is attached, and in a case in which the voltage command value of a half cycle is less than the original voltage command value, a suffix B is attached. That is, when the voltage command values of respective phases are equal to or more than the original voltage command values, the voltage command values of respective phases are denoted as $D_{UA}$, $D_{VA}$, and $D_{WA}$ respectively, and when the voltage command values of respective phases are less than the original voltage command values, the voltage command values of respective phases are denoted as $D_{UB}$, $D_{VB}$, and $D_{WB}$ respectively.

The third embodiment is characterized in that modified PWM pulses are generated by comparing these voltage command values $D_{UA}$, $D_{UB}$, $D_{VA}$, $D_{VB}$, $D_{WA}$, and $D_{WB}$ with the triangle wave.

For respective phases, ratios $A_U$, $A_V$, and $A_W$ are prepared, and $D_{UA}$, $D_{UB}$, $D_{VA}$, $D_{VB}$, $D_{WA}$, and $D_{WB}$ are defined by the following formulas 4 to 9. Each of the ratios $A_U$, $A_V$, and $A_W$ is a parameter representing a degree of divergence between the voltage command value in Example 6 ($D_{UA}$, $D_{UB}$, $D_{VA}$, $D_{VB}$, $D_{WA}$, or $D_{WB}$) and the original voltage command value ($D_U$, $D_V$, or $D_W$), which corresponds to a command value ratio in the claims. In the present specification, the ratio is referred to as a "weight". These weights $A_U$, $A_V$, and $A_W$ are preferably not less than 1 and not more than 2.

When the weight A is 1, the voltage command value in a cycle of the triangle wave becomes equal to a voltage command value in the conventional three-phase modulation (for example, $D_{UA}=D_{UB}=D_U$).

$$D_{UA}=A_U \cdot D_U \text{ (However, } D_{UA}=1 \text{ when } 1 \le A_U \cdot D_U) \quad \text{(formula 4)}$$

$$D_{UB}=2D_U-D_{UA} \quad \text{(formula 5)}$$

$$D_{VA}=A_V \cdot D_V \text{ (However, } D_{VA}=1 \text{ when } 1 \le A_V \cdot D_V) \quad \text{(formula 6)}$$

$$D_{VB}=2D_V-D_{VA} \quad \text{(formula 7)}$$

$$D_{WA}=A_W \cdot D_W \text{ (However, } D_{WA}=1 \text{ when } 1 \le A_W \cdot D_W) \quad \text{(formula 8)}$$

$$D_{WB}=2D_W-D_{WA} \quad \text{(formula 9)}$$

By defining the voltage command value as described above, although magnitude of the voltage command value varies for each half cycle of the triangle wave, a time average of the voltage command value in one cycle of the triangle wave becomes equal to the original voltage command value. Originally, the PWM control equivalently obtains a target voltage by adjusting a pulse width as magnitude of the voltage command value in a given period. Therefore, even if the magnitude of the voltage command value varies every half cycle of the triangle wave, if the time average value in one cycle is equal to the original voltage command value, the target voltage can be outputted from the inverter.

The above description will be concretely described with reference to FIG. 8 below. Suppose a case in which the original voltage command values of respective phases $D_U$, $D_V$, and $D_W$ to be compared with the triangle wave are defined as the following formulas 10 to 12. In these formulas, λ is a modulation factor and is an element for determining magnitude of the output voltage of the inverter (amplitude of AC voltage). Also, θ is an angle.

$$D_U = \frac{\lambda \cos\theta + 1}{2} \quad \text{(formula 10)}$$

$$D_V = \frac{\lambda \cos\left(\theta - \frac{2\pi}{3}\right) + 1}{2} \quad \text{(formula 11)}$$

$$D_W = \frac{\lambda \cos\left(\theta - \frac{4\pi}{3}\right) + 1}{2} \quad \text{(formula 12)}$$

Figure 8:
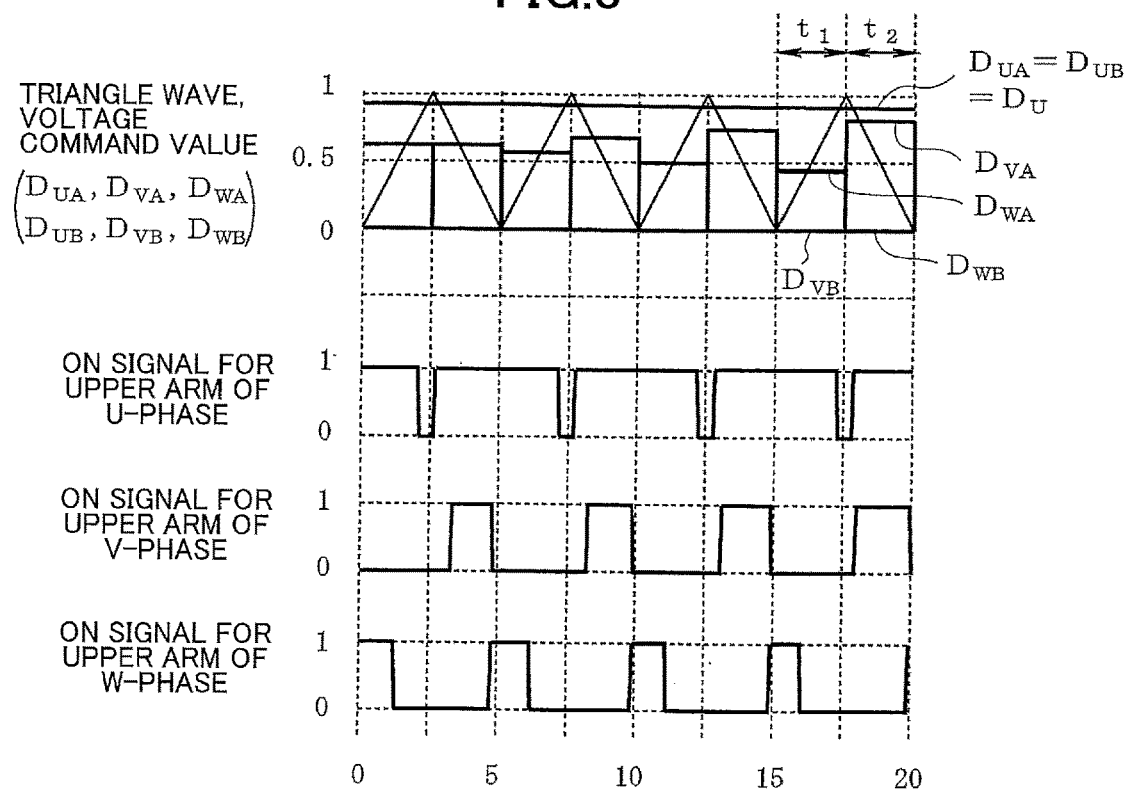
FIG. 8 illustrates an operation waveform diagram of each part of the inverter according to Example 6 in the third embodiment.

FIG. 8 is an example of operation waveform diagram illustrating waveforms of each part of the inverter in a range of 0≤θ≤20°, under the condition of λ=0.8, $A_U$=1, $A_V$=2, and $A_W$=2.

When the voltage command value is larger than the triangle wave, the switching element of the upper arm of each phase of the inverter is turned on, and the switching element of the lower arm is turned on in a complementary relationship thereto.

In FIG. 8, the voltage command value of the V-phase is set to $D_{VB}$ which is smaller than the original voltage command value $D_V$ in the first half period $t_1$ of the triangle wave, and is set to $D_{VA}$ which is larger than the original voltage command value $D_V$ in the second half period $t_2$. Conversely, the voltage command value of the W-phase is opposite to the V-phase. That is, in the first half period $t_1$, the voltage command value is set to $D_{WA}$ which is larger than the original voltage command value $D_W$, and in the second half period $t_2$, the voltage command value is set to $D_{WB}$ which is smaller than the original voltage command value $D_W$.

In addition, the voltage command value of the U-phase is set to the same as the original voltage command value $D_U$ ($D_{UA}=D_{UB}=D_U$) over the periods $t_1$ and $t_2$, and the magnitude is not changed.

The above described conditions are summarized in Table 1.

TABLE 1

| | Angle range θ | 0 ≤ θ ≤ 20° |
|---|---|---|
| | modulation factor λ | 0.8 |
| U-phase | Weight $A_U$ | 1 |
| | Voltage command value of 1$^{st}$ half (ascending period) of carrier triangle wave | $D_U$ |
| | Voltage command value of 2$^{nd}$ half (descending period) of carrier triangle wave | $D_U$ |
| V-phase | Weight $A_V$ | 2 |
| | Voltage command value of 1$^{st}$ half (ascending period) of carrier triangle wave | $D_{VB}$ |
| | Voltage command value of 2$^{nd}$ half (descending period) of carrier triangle wave | $D_{VA}$ |
| W-phase | Weight $A_W$ | 2 |
| | Voltage command value of 1$^{st}$ half (ascending period) of carrier triangle wave | $D_{WA}$ |
| | Voltage command value of 2$^{nd}$ half (descending period) of carrier triangle wave | $D_{WB}$ |

Figure 9:
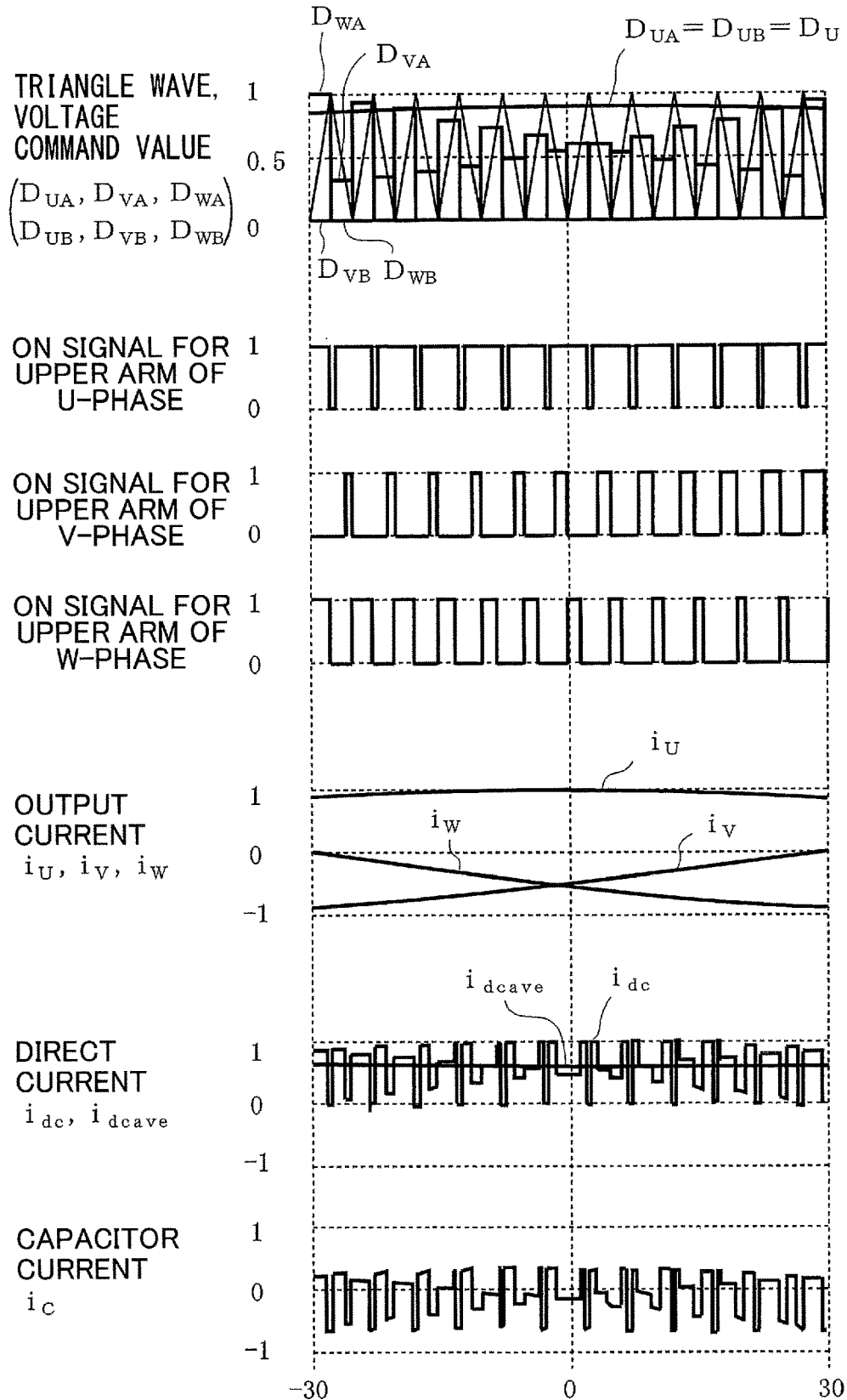
FIG. 9 illustrates another operation waveform diagram of each part of the inverter according to Example 6 in the third embodiment.

Next, FIG. 9 illustrates an operation waveform diagram of each part of the inverter under the condition illustrated in Table 2. Further, FIG. 10 illustrates an operation waveform diagram in a case in which the conventional three-phase modulation is employed, and the voltage command values of respective phases $D_U$, $D_V$, and $D_W$ are the same as the original voltage command values ($D_{UA}=D_{UB}=D_U$, $D_{VA}=D_{VB}=D_V$, $D_{WA}=D_{WB}=D_W$).

TABLE 2

| | Angle range θ | −30° ≤ θ ≤ 30° |
|---|---|---|
| | Modulation factor λ | 0.8 |
| | Peak value of load current | 1 |
| | Load power factor | 1 |
| U-phase | Weight $A_U$ | 1 |
| | Voltage command value of 1$^{st}$ half (ascending period) of carrier triangle wave | $D_U$ |
| | Voltage command value of 2$^{nd}$ half (descending period) of carrier triangle wave | $D_U$ |
| V-phase | Weight $A_V$ | 2 |
| | Voltage command value of 1$^{st}$ half (ascending period) of carrier triangle wave | $D_{VB}$ |
| | Voltage command value of 2$^{nd}$ half (descending period) of carrier triangle wave | $D_{VA}$ |
| W-phase | Weight $A_W$ | 2 |
| | Voltage command value of 1$^{st}$ half (ascending period) of carrier triangle wave | $D_{WA}$ |
| | Voltage command value of 2$^{nd}$ half (descending period) of carrier triangle wave | $D_{WB}$ |

Figure 10:
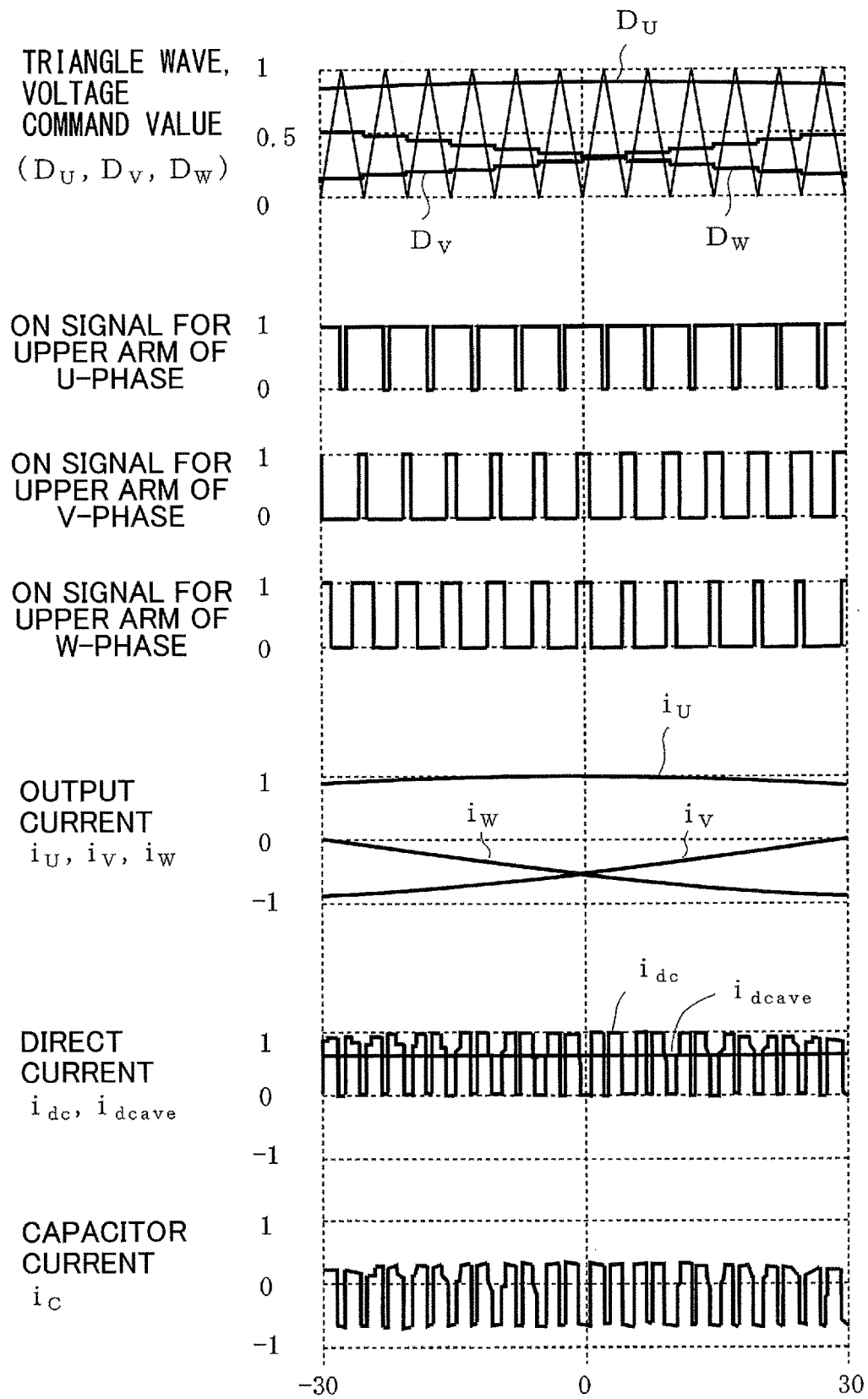
FIG. 10 illustrates an operation waveform diagram in a case in which a conventional three-phase modulation is employed.

Waveforms of current illustrated in FIG. 9 or 10 represent waveforms of current of respective parts illustrated in above described FIG. 18. Further, $i_{dcave}$ in FIGS. 9 and 10 is current that flows out of the DC voltage source B, which corresponds to $i_{bat}$ in FIG. 18. The $i_{dcave}$ may also be regarded as a time average of current $i_{dc}$ flowing in the DC part of the inverter. Further, capacitor current (ripple current component) $i_C$ can be expressed as $i_C=i_{dc}-i_{dcave}$.

With respect to the capacitor current $i_C$ illustrated in FIG. 9 or 10, it is apparent that a rate of change of the current in FIG. 9 is less than that in FIG. 10. This means that the effective value of $i_C$ can be reduced according to Example 6 as compared with the case in which the conventional three-phase modulation is employed.

Further, as is apparent from ON signals for the switching elements of respective arms in FIG. 9, all of the switching elements are repeatedly turned on and off. That is, it is understood that what is called three-phase modulation is performed.

That is, in order to reduce the capacitor current $i_C$, in the above-mentioned prior applications, what is called two-phase modulation is performed, in which one voltage command value among the three phase voltage command values is fixed at a maximum value or a minimum value of a carrier triangle wave. On the other hand, in Example 6, because it is possible to reduce $i_C$ without performing two-phase modulation, it is possible to solve problems caused by two-phase modulation such as overheating of a specific switching element and increase in noise.

As described above, in Example 6, a case, in which an angle range is −30°≤θ≤30° and weight of the U-phase, V-phase, and W-phase are $A_U$=1, $A_V$=2, and $A_W$=2, is described, for example. However, even if the weights are changed in other angle ranges such as $A_U$=2, $A_V$=1, and $A_W$=2, the same effect can be obtained.

Example 7

Next, Example 7 according to the third embodiment will be described. In Example 7, operation waveforms of each part of the inverter were observed under the condition illustrated in Table 3, in order to investigate influence of the weight A on the effective value of current of the capacitor C.

TABLE 3

|  | Angle range θ | −30° ≤ θ ≤ 30° |
|---|---|---|
|  | Modulation factor λ | 0.2 to 1 |
|  | Peak value of load current | 1 |
|  | Load power factor | 1 |
| U-phase | Weight $A_U$ | 1 |
|  | Voltage command value of 1$^{st}$ half (ascending period) of carrier triangle wave | $D_U$ |
|  | Voltage command value of 2$^{nd}$ half (descending period) of carrier triangle wave | $D_U$ |
| V-phase | Weight $A_V$ = A | 1 to 2 |
|  | Voltage command value of 1$^{st}$ half (ascending period) of carrier triangle wave | $D_{VB}$ |
|  | Voltage command value of 2$^{nd}$ half (descending period) of carrier triangle wave | $D_{VA}$ |
| W-phase | Weight $A_W$ = A | 1 to 2 |
|  | Voltage command value of 1$^{st}$ half (ascending period) of carrier triangle wave | $D_{WA}$ |
|  | Voltage command value of 2$^{nd}$ half (descending period) of carrier triangle wave | $D_{WB}$ |

More specifically, the influence of the weight A on the effective value of current of the capacitor C is investigated for each modulation rate λ, when the weight of the U-phase $A_U$ is 1, the weight of the V-phase $A_V$ is equal to the weight of the W-phase $A_W$ ($A_V$=$A_W$=A), and the angle range is −30°≤θ≤30°.

Even in the angle range being other than −30°≤θ≤30°, if the weights of the phases are exchanged in the same manner as described above, the result is similar to the case in which the angle range is −30°≤θ≤30°.

Figure 11:
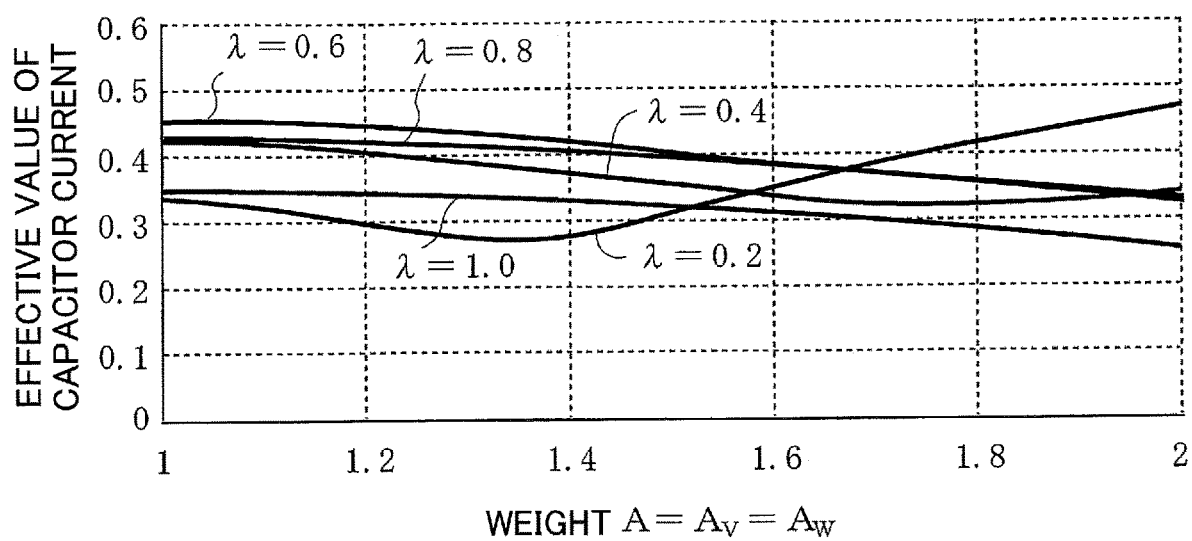
FIG. 11 is a diagram of Example 7 according to the third embodiment illustrating a relationship between a weight and an effective value of capacitor current for each modulation factor.

FIG. 11 is a diagram illustrating a relationship between the weight A and the effective value of the capacitor current for each modulation factor.

In FIG. 11, the condition of the weight A=1 is the same as that in the conventional three-phase modulation. It is found that the effective value of the capacitor current can be reduced by setting the weight A>1, except for the case of λ=0.2. Also, in a case in which the modulation factor is 0.6≤A≤1, the effective value of the capacitor current becomes the minimum when A=2.

Reason for these results is assumed like the following: a timing at which each switching element is turned on and off varies depending on the balance between the weight A and the modulation factor λ, and thereby the magnitude of the current flowing through the DC part of the inverter changes.

Based on the above investigation result, a case in which λ is 0.2 will be explained concretely with reference to the operation waveform.

Figure 12:
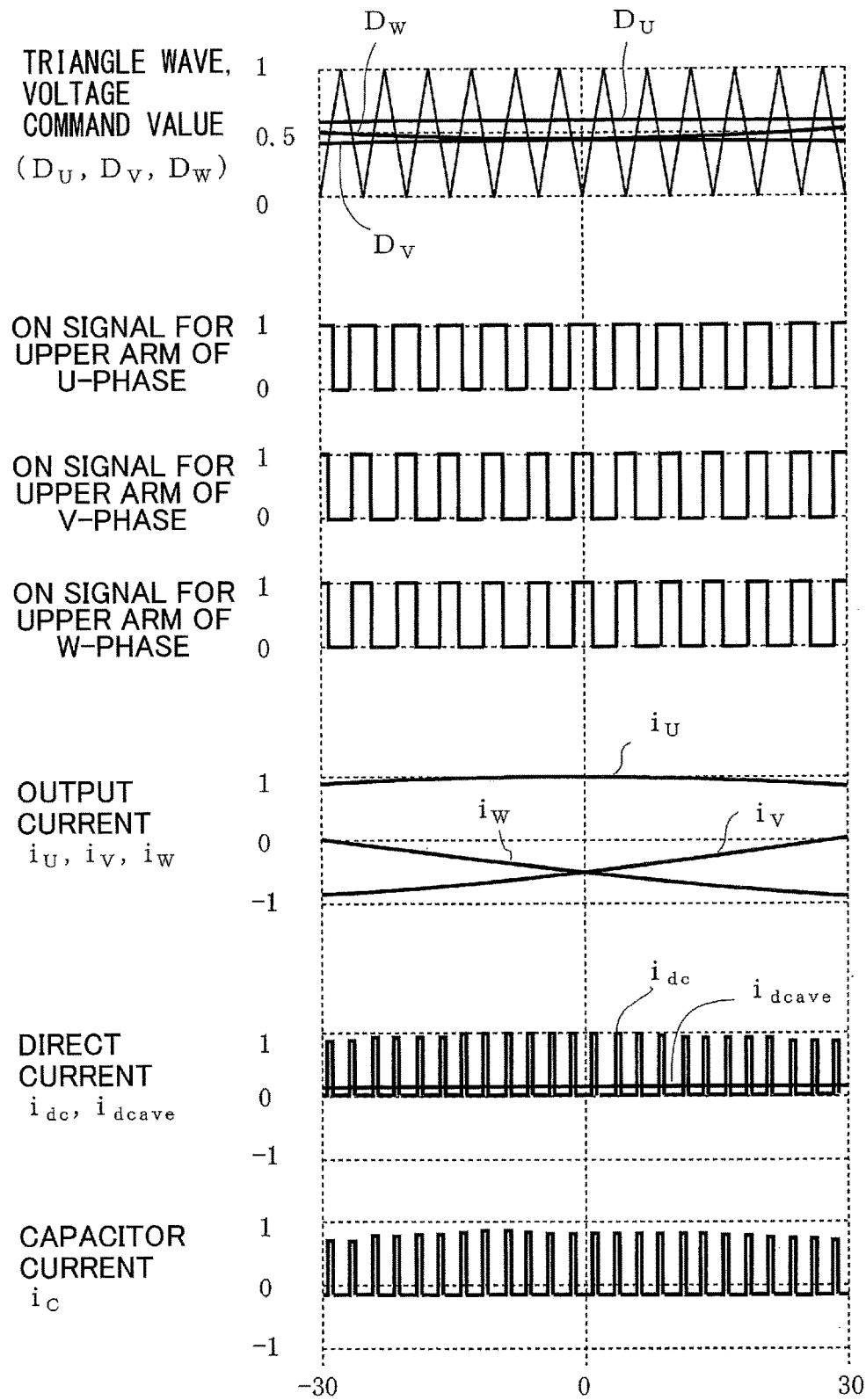
FIG. 12 illustrates an operation waveform diagram of each part of the inverter in an operation example 1 of Example 7 according to the third embodiment.
Figure 13:
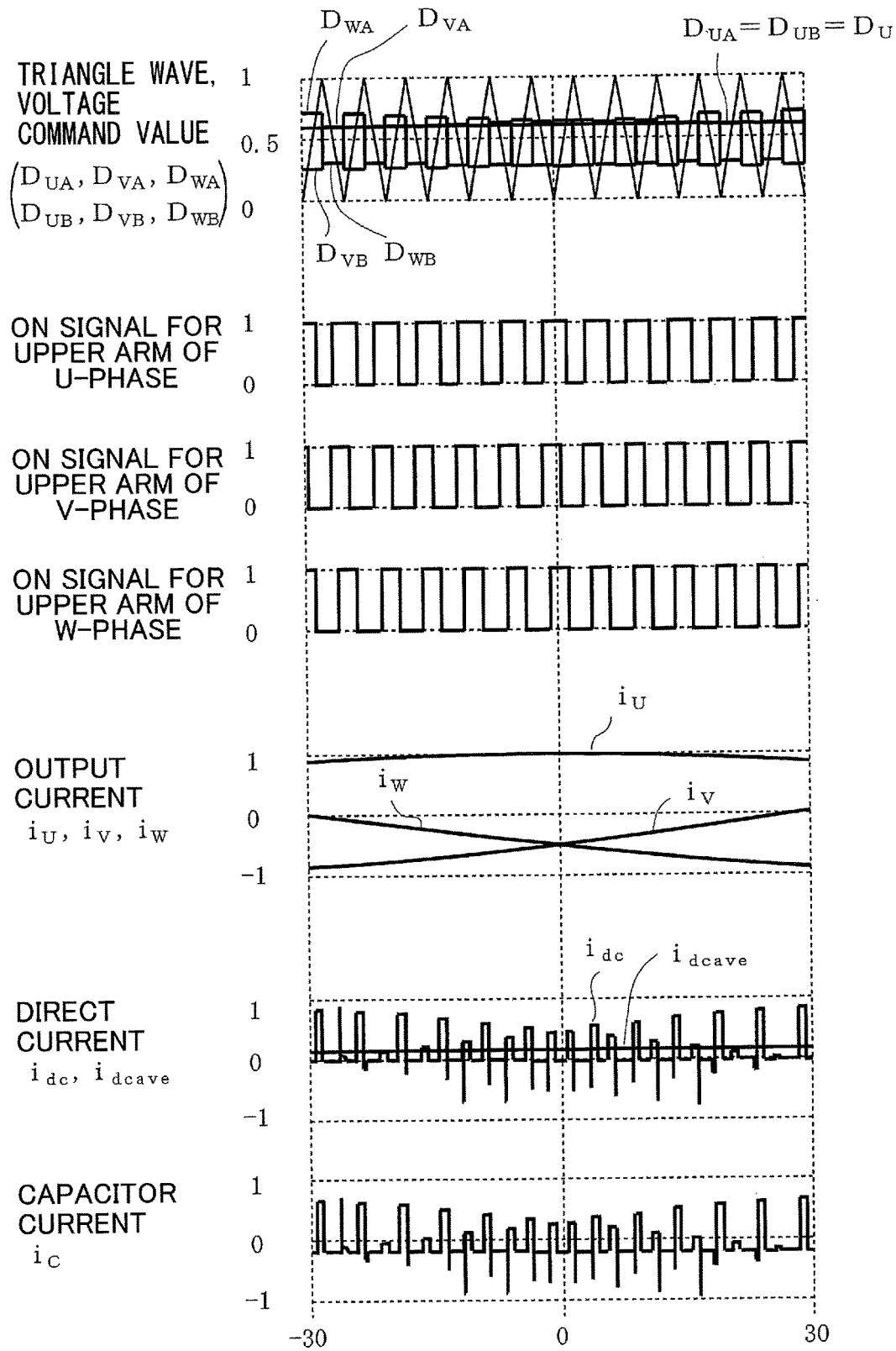
FIG. 13 illustrates an operation waveform diagram of each part of the inverter in an operation example 2 of Example 7 according to the third embodiment.
Figure 14:
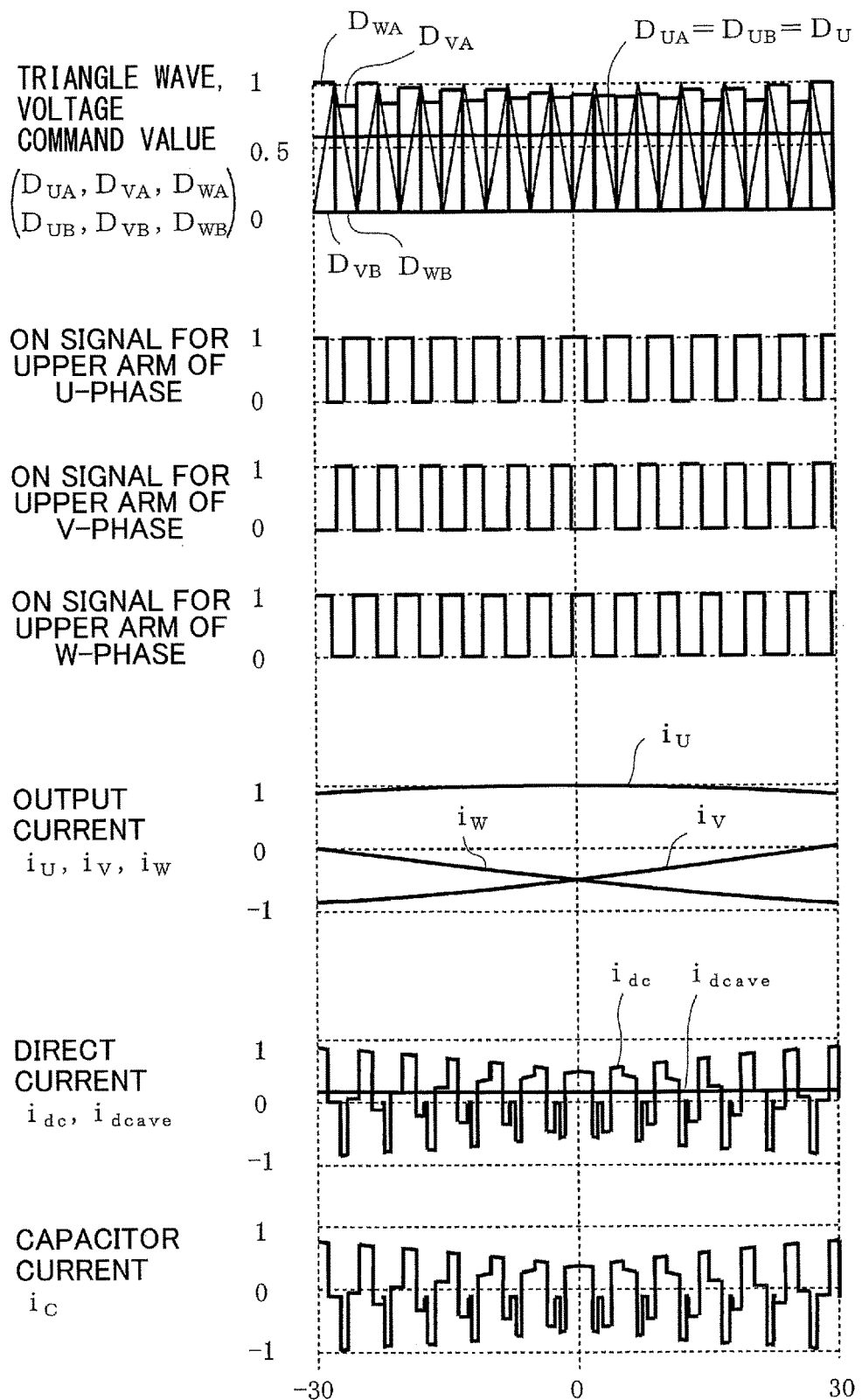
FIG. 14 illustrates an operation waveform diagram of each part of the inverter in an operation example 3 of Example 7 according to the third embodiment.

FIG. 12, FIG. 13, and FIG. 14 are operation waveform diagrams, which respectively illustrate a case of $A_U$=$A_V$=$A_W$=1 (hereinafter referred to as "operation example 1"), a case of $A_U$=1 and $A_V$=$A_W$=1.4 (hereinafter referred to as "operation example 2"), and a case of $A_U$=1 and $A_V$=$A_W$=2 (hereinafter referred to as "operation example 3").

The operation example 1 in FIG. 12 is the same as an operation in the conventional three-phase modulation. In this case, as the inverter, in the angle range of −30°≤θ≤30°, there are relatively many periods in which the upper arm of the U-phase is ON and the lower arm, of the V-phase and W-phase is ON. Note that such an on/off state of each switching element is denoted as (1, 0, 0), and the on/off state of each phase is described based on this notation.

When the ON/OFF state of each phase is (1, 0, 0), the U-phase current $i_U$ flows as the DC current $i_{dc}$ of the inverter. As is apparent from FIG. 12, the magnitude of the current $i_U$ is the largest among the currents of the respective phases.

With respect to the operation example 2 in FIG. 13, in the angle range of −30°≤θ≤30°, there are relatively many periods in which the on/off state of each phase is (1, 0, 1). In this case, the V-phase current $i_V$ flows as the DC current $i_{dc}$. In this case, as the DC current $i_{dc}$, with respect to the V-phase current $i_V$, current $-i_V$ of an opposite direction flows. At this time, since the $i_V$ is in the negative direction, the direct current $i_{dc}$ flows in the positive direction. Also, the size of $i_V$ is smaller than the size of $i_U$ described with reference to FIG. 12. That is, the DC current $i_{dc}$ in the operation example 2 is smaller than the current flowing in the conventional technique. Therefore, when $A_U$=1 and $A_V$=$A_W$=1.4, the effective value of the capacitor current $i_C$ can be reduced as compared with the conventional three-phase modulation.

With respect to the operation example 3 in FIG. 14, in the angle range of −30°≤θ≤30°, there are relatively many periods in which the on/off state of each phase is (1, 0, 1). The DC current $i_{dc}$ that flows in this case is as described with reference to FIG. 13.

The second largest on/off state is (0, 1, 0). In this case, the V-phase current $i_V$ flows as the DC current $i_{dc}$. However, as the direction is negative, a direction of the DC current $i_{dc}$ is also negative. Therefore, a case in which the DC current $i_{dc}$ takes a positive value and a case in which the DC current $i_{dc}$ takes a negative value are repeated, and because of this phenomenon, the effective value of the capacitor current $i_C$ becomes larger than that in the conventional three-phase modulation.

As is apparent from the above description, if the weight A is appropriately set in accordance with the magnitude of the modulation factor, the effective value of the capacitor current $i_C$ can be minimized.

Example 8

Next, Example 8 according to the third embodiment will be described. In Example 8, operation waveforms of each part of the inverter were observed under the condition illustrated in Table 4, in order to investigate influence of the load power factor on the effective value of current of the capacitor.

Note that the condition in Table 4 is the same as the condition described in Example 7, except that the load power factor is lessened in the condition in Table 4.

TABLE 4

| Angle range θ | $-30° \leq \theta \leq 30°$ |
|---|---|
| Modulation factor λ | 0.2 |
| Peak value of load current | 1 |
| Load power factor | 0.866 |

Also, the weight A and the like are set to the following conditions (conditions 1 to 3) illustrated in Tables 5 to 7.

TABLE 5

<Condition 1>

| | | $-30° \leq \theta \leq 30°$ |
|---|---|---|
| U-phase | Weight $A_U$ | 1 |
| | Voltage command value of 1$^{st}$ half (ascending period) of carrier triangle wave | $D_U$ |
| | Voltage command value of 2$^{nd}$ half (descending period) of carrier triangle wave | $D_U$ |
| V-phase | Weight $A_V$ | 1 |
| | Voltage command value of 1$^{st}$ half (ascending period) of carrier triangle wave | $D_V$ |
| | Voltage command value of 2$^{nd}$ half (descending period) of carrier triangle wave | $D_V$ |
| W-phase | Weight $A_W$ | 1 |
| | Voltage command value of 1$^{st}$ half (ascending period) of carrier triangle wave | $D_W$ |
| | Voltage command value of 2$^{nd}$ half (descending period) of carrier triangle wave | $D_W$ |

TABLE 6

<Condition 2>

| | | $-30° \leq \theta \leq 30°$ |
|---|---|---|
| U-phase | Weight $A_U$ | 1 |
| | Voltage command value of 1$^{st}$ half (ascending period) of carrier triangle wave | $D_U$ |
| | Voltage command value of 2$^{nd}$ half (descending period) of carrier triangle wave | $D_U$ |
| V-phase | Weight $A_V$ | 1.4 |
| | Voltage command value of 1$^{st}$ half (ascending period) of carrier triangle wave | $D_{VB}$ |
| | Voltage command value of 2$^{nd}$ half (descending period) of carrier triangle wave | $D_{VA}$ |
| W-phase | Weight $A_W$ | 1.4 |
| | Voltage command value of 1$^{st}$ half (ascending period) of carrier triangle wave | $D_{WA}$ |
| | Voltage command value of 2$^{nd}$ half (descending period) of carrier triangle wave | $D_{WB}$ |

TABLE 7

<Condition 3>

| | | $-30° \leq \theta \leq 0°$ | $0° \leq \theta \leq 30°$ |
|---|---|---|---|
| U-phase | Weight $A_U$ | 1.4 | 1 |
| | Voltage command value of 1$^{st}$ half (ascending period) of carrier triangle wave | $D_{UB}$ | $D_U$ |
| | Voltage command value of 2$^{nd}$ half (descending period) of carrier triangle wave | $D_{UA}$ | $D_U$ |
| V-phase | Weight $A_V$ | 1.2 | 1.2 |
| | Voltage command value of 1$^{st}$ half (ascending period) of carrier triangle wave | $D_{VB}$ | $D_{VB}$ |
| | Voltage command value of 2$^{nd}$ half (descending period) of carrier triangle wave | $D_{VA}$ | $D_{VA}$ |
| W-phase | Weight $A_W$ | 1 | 1.4 |
| | Voltage command value of 1$^{st}$ half (ascending period) of carrier triangle wave | $D_W$ | $D_{WA}$ |
| | Voltage command value of 2$^{nd}$ half (descending period) of carrier triangle wave | $D_W$ | $D_{WB}$ |

In the condition 1 in Table 5, as the weight of each phase is 1 (that is, $A_U = A_V = A_W = 1$), the condition corresponds to a case of the conventional three-phase modulation.

In the condition 2 in Table 6, the weight of each phase is the same as the weight used in the operation example 2 in Example 7, that is, $A_U = 1$ and $A_V = A_W = 1.4$.

In the condition 3 in Table 7, the weight is $A_U = 1.4$, $A_V = 1.2$, and $A_W = 1$ when the angle range is $-30° \leq \theta \leq 0°$, and the weight is $A_U = 1$, $A_V = 1.2$, and $A_W = 1.4$ when the angle range is $0° \leq \theta \leq 30°$.

In Example 6 or 7, with respect to two phases to which the weights are given, magnitude of the weights given to the two phases is the same. However, Example 8 differs from Example 6 or 7 in that the magnitude of the weights given to the two phases (the two phases are the U-phase and the V-phase when the angle range is $-30° \leq \theta \leq 0°$, and are the V-phase and the W-phase when the angle range is $0° \leq \theta \leq 30°$) is different from each other.

Further, in Example 6 or 7, when weights are given to, for example, the U-phase and the V-phase, the voltage command values of the two phases are configured such that magnitude relation of the original voltage command value and the voltage command value is different from each other and that the magnitude relation during the second half of the triangle wave is inverted from the magnitude relation during the first half of the triangle wave. For example, during the first half of the triangle wave, the voltage command values of the U-phase and V-phase are set to $D_{UA}$ and $D_{VB}$ respectively. Conversely, during the second half of the triangle wave, the voltage command values of the U-phase and V-phase are set to $D_{UB}$ and $D_{VA}$ respectively (as described earlier, the suffix "A" of the voltage command value means "converted voltage command value≥original voltage command value", and the suffix "B" of the voltage command value means "converted voltage command value<original voltage command value").

Conversely, in Example 8, especially in the angle range of $-30° \leq \theta \leq 0°$, the magnitude relation during the second half of the triangle wave is made to be the same as the magnitude relation during the first half of the triangle wave, which is a difference from Example 6 or 7. For example, when weights are given to the U-phase and the V-phase, in the angle range of −30°≤θ≤0°, the voltage command values of the U-phase and V-phase during the first half of the triangle wave are set to $D_{UA}$ and $D_{VA}$ respectively, and the voltage command values of the U-phase and V-phase during the second half of the triangle wave are set to $D_{UB}$ and $D_{VB}$ respectively.

Figure 15:
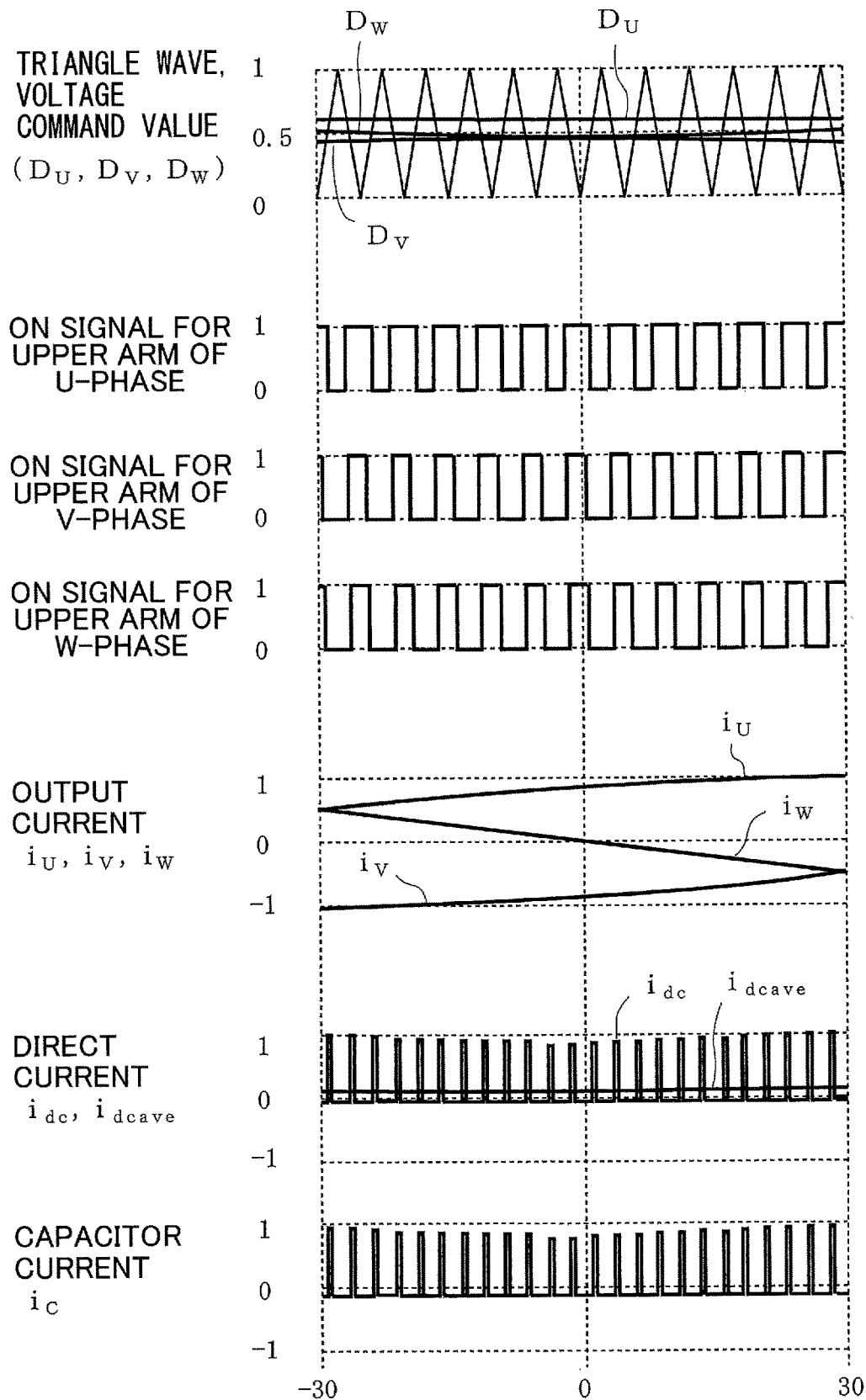
FIG. 15 illustrates an operation waveform diagram in a case in which a conventional three-phase modulation is employed (under condition 1 of Example 8 according to the third embodiment)
Figure 16:
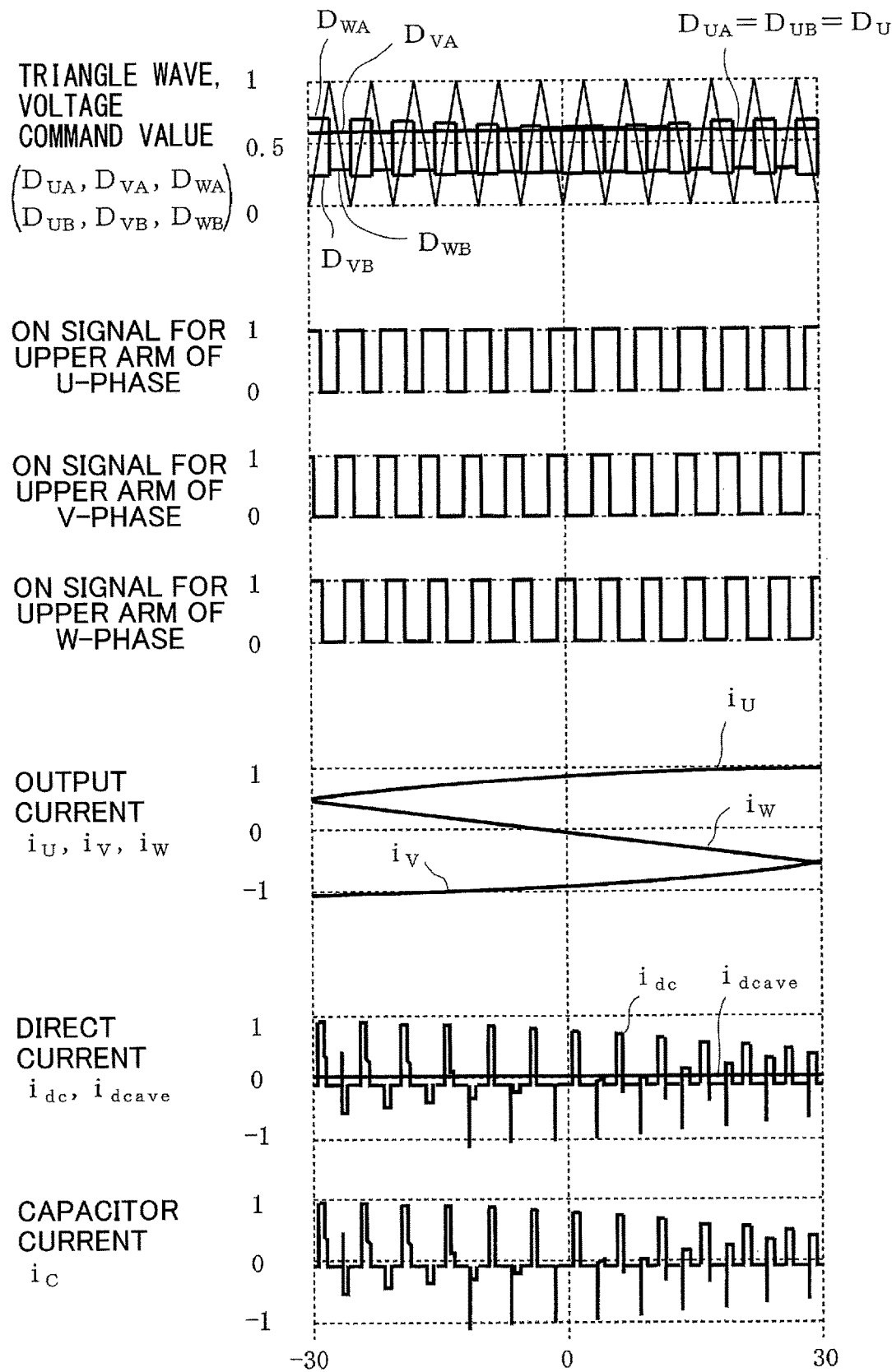
FIG. 16 illustrates an operation waveform diagram of each part of the inverter in condition 2 of Example 8 according to the third embodiment.
Figure 17:
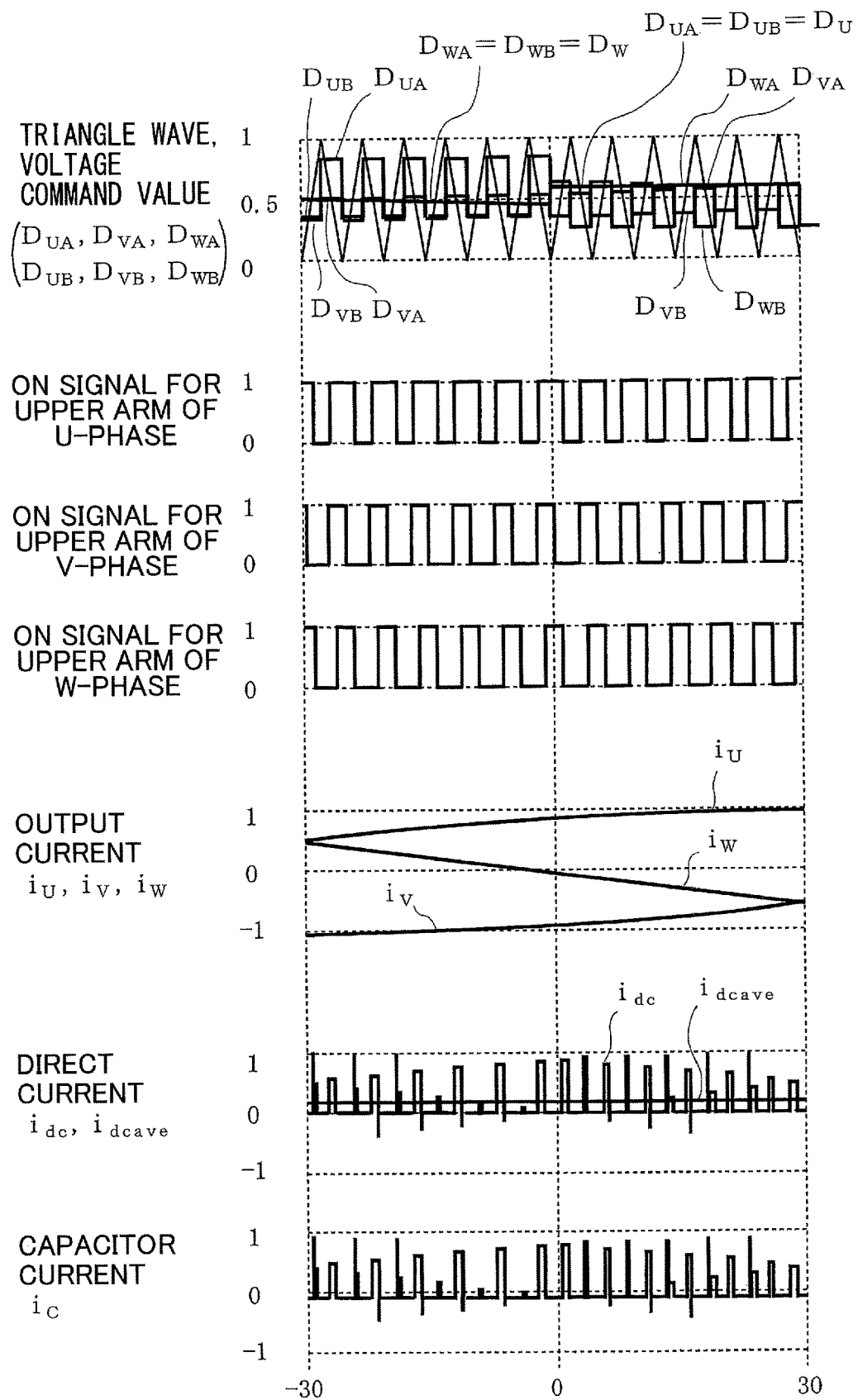
FIG. 17 illustrates an operation waveform diagram of each part of the inverter in condition 3 of Example 8 according to the third embodiment.

Table 8 illustrates the effective value of the capacitor current $i_C$ in the angle range of −30°≤θ≤0° when the above described conditions 1 to 3 are applied. Further, FIG. 15, FIG. 16, and FIG. 17 are operation waveform diagrams under the condition 1, the condition 2, and the condition 3, respectively.

TABLE 8

| Condition | Effective value of capacitor current |
|---|---|
| Condition 1 (conventional control method) | 0.31 |
| Condition 2 (corresponding to Example 7) | 0.36 |
| Condition 3 (corresponding to Example 8) | 0.26 |

According to Table 8, in the condition 2, despite the weight A being given which was effective in Example 7, the effective value of the capacitor current becomes larger than that of the condition 1 (that is, the effective value of the capacitor current when the conventional three-phase modulation is applied). This is because of deterioration of the load power factor, which can be understood by comparing FIG. 15 with FIG. 16. Especially in the angle range of −30°≤θ≤0°, the current in FIG. 16 (condition 2) is apparently larger than that of FIG. 15.

On the other hand, in the condition 3, the effective value of the capacitor current is less than that of the condition 1. This is because, by setting the condition 3 illustrated in Table 7, it is possible to realize the ON/OFF state of the switching element such that the current $i_{dc}$ of the DC part of the inverter becomes small, which can also be understood by comparing FIG. 15 with FIG. 17.

In the above-described Examples 6 to 8, in the first half period and the second half period (first half period=second half period) of one cycle of the symmetric triangle wave, the voltage command values of at least two phases are increased/decreased with respect to the original voltage command value. However, the present invention is not limited to such examples.

For example, in a case in which an asymmetric triangle wave is employed, the voltage command values may be increased or decreased with respect to the original voltage command value in the ascending period and the descending period of the triangle wave (the ascending period≠the descending period), as long as the time average of the voltage command value of each phase within one cycle of the triangle wave is equal to the original voltage command value of the corresponding phase.

In the present invention, over n cycles of the carrier (n is a plural number, n=$n_1$+$n_2$, $n_1$ and $n_2$ are each an integer greater or equal to 1), a voltage command value increased from the original voltage command value may be used for comparison with the carrier during $n_1$ cycle(s), and a voltage command value decreased from the original voltage command value may be used for comparison with the carrier during $n_2$ cycle(s). In this case, the voltage command value should be configured such that the time average value of the voltage command value of each phase increased/decreased over the n cycles becomes equal to the original voltage command value of the corresponding phase.

A control device of the inverter according to each example in the third embodiment can also be realized by the above mentioned functional block diagram in FIG. 7.

That is, the voltage command value generator 13 generates the voltage command values $D_{UA}$, $D_{UB}$, $D_{VA}$, $D_{VB}$, $D_{WA}$, and $D_{WB}$, based on the detected voltage and current, the original voltage command values $D_U$, $D_V$, and $D_W$, the weights $A_U$, $A_V$, and $A_W$, the load power factor, and the like. Further, the comparator 14 generates the modified PWM pulses by comparing the voltage command values $D_{UA}$, $D_{UB}$, $D_{VA}$, $D_{VB}$, $D_{WA}$, and $D_{WB}$ with the symmetric triangle wave or the asymmetric triangle wave generated by the counter 12 in the carrier generator 11. Subsequent operation is the same as that in the first or second embodiment.

CONCLUSION

According to one aspect of the present invention, a control method of an inverter is provided. The inverter includes a plurality of series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of polyphase alternate-current (AC) electrical power. In the method, the switching elements are controlled by using pulse width modulation (PWM) pulses obtained by comparing output voltage command values of respective phases with a carrier.

The method includes a step of generating modified PWM pulses of respective phases based on an output of a counter common to the respective phases, and a step of controlling the switching elements by using the modified PWM pulses. Each of the modified PWM pulses is configured such that a total pulse width, in a period corresponding to one or more cycles of the carrier, is substantially equal to a total pulse width of an assumed PWM pulse of a corresponding phase among the respective phases, the assumed PWM pulse being obtained by comparing, with the carrier, a time average value of an output voltage of the corresponding phase in the period, and at least one of a generation timing and a generation frequency of at least one of the modified PWM pulses is changed from the assumed PWM pulse.

According to another aspect of the present invention, a control method of an inverter is provided. The inverter includes a plurality of series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of polyphase alternate-current (AC) electrical power. In the method, the switching elements are controlled by using PWM pulses obtained by comparing output voltage command values of respective phases with a carrier.

The method is characterized by generating modified PWM pulses of respective phases based on an output of a counter common to the respective phases; and controlling the switching elements by using the modified PWM pulses. Each of the modified PWM pulses is configured such that a total pulse width, in a period corresponding to one or more cycles of the carrier, is substantially equal to a total pulse width of an assumed PWM pulse of a corresponding phase among the respective phases, the assumed PWM pulse being obtained by comparing, with the carrier, a time average value of an output voltage of the corresponding phase in the period, and at least one of a generation timing and a generation frequency of at least one of the modified PWM pulses is changed from the assumed PWM pulse, exceeding a necessary extent for control.

The output of the counter may be used for generating the carrier with which the output voltage command values of respective phases are compared, when generating the modified PWM pulses.

The carrier may be a triangle wave or a sawtooth wave.

According to another aspect of the present invention, a control device of an inverter is provided. The inverter includes a plurality of series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of polyphase alternate-current (AC) electrical power. The control device of the inverter generates PWM pulses for controlling the switching elements by comparing output voltage command values of respective phases with a carrier.

The control device is characterized by generating modified PWM pulses of respective phases based on an output of a counter common to the respective phases; and actuating the switching elements by using the modified PWM pulses. Each of the modified PWM pulses is configured such that a total pulse width, in a period corresponding to one or more cycles of the carrier, is substantially equal to a total pulse width of an assumed PWM pulse of a corresponding phase among the respective phases, the assumed PWM pulse being obtained by comparing, with the carrier, a time average value of an output voltage of the corresponding phase in the period, and at least one of a generation timing and a generation frequency of at least one of the modified PWM pulses is changed from the assumed PWM pulse.

According to another aspect of the present invention, an inverter includes a plurality of series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of polyphase alternate-current (AC) electrical power. The inverter is configured to control the switching elements by using PWM pulses obtained by comparing output voltage command values of respective phases with a carrier.

The inverter is characterized by generating modified PWM pulses of respective phases based on an output of a counter common to the respective phases; and actuating the switching elements by using the modified PWM pulses. Each of the modified PWM pulses is configured such that a total pulse width, in a period corresponding to one or more cycles of the carrier, is substantially equal to a total pulse width of an assumed PWM pulse of a corresponding phase among the respective phases, the assumed PWM pulse being obtained by comparing, with the carrier, a time average value of an output voltage of the corresponding phase in the period, and at least one of a generation timing and a generation frequency of at least one of the modified PWM pulses is changed from the assumed PWM pulse.

According to another aspect of the present invention, a control method of a three-phase inverter is provided. The three-phase inverter includes a plurality of series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. The method for controlling the switching elements by using PWM pulses obtained by comparing output voltage command values of respective phases with a triangle wave includes a step of holding an AC output voltage of a first phase at a voltage of a positive electrode or a negative electrode of the DC voltage source for a predetermined time range equal to a cycle of the triangle wave, and a step of performing switching of the switching elements for second and third phases by using a PWM pulse for the second phase and a PWM pulse for the third phase, the PWM pulse for the second phase and the PWM pulse for the third phase being obtained by comparing an output voltage command value of the second phase and an output voltage command value of the third phase with the triangle wave respectively.

The method is characterized in that:

the output voltage command value of the second phase is configured such that magnitude of the output voltage command value of the second phase in an ascending period of the triangle wave is larger than an average of the output voltage command value of the second phase during the cycle of the triangle wave, and that magnitude of the output voltage command value of the second phase in a descending period of the triangle wave is smaller than the average of the output voltage command value of the second phase, and the output voltage command value of the third phase is configured such that magnitude of the output voltage command value of the third phase in the ascending period of the triangle wave is smaller than an average of the output voltage command value of the third phase during the cycle of the triangle wave, and that magnitude of the output voltage command value of the third phase in the descending period of the triangle wave is larger than the average of the output voltage command value of the third phase.

According to another aspect of the present invention, a control method of a three-phase inverter is provided. The three-phase inverter includes three series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. The method for controlling the switching elements by using PWM pulses obtained by comparing output voltage command values of respective phases with a triangle wave includes a step of holding an AC output voltage of a first phase at a voltage of a positive electrode or a negative electrode of the DC voltage source for a predetermined time range equal to a cycle of the triangle wave, and a step of performing switching of the switching elements for second and third phases by using a PWM pulse for the second phase and a PWM pulse for the third phase, the PWM pulse for the second phase and the PWM pulse for the third phase being obtained by comparing an output voltage command value of the second phase and an output voltage command value of the third phase with the triangle wave respectively.

The method is characterized in that:

during a first cycle of two consecutive cycles of the triangle wave, the output voltage command value of the second phase is configured such that magnitude of the output voltage command value of the second phase in an ascending period of the triangle wave is larger than an average of the output voltage command value of the second phase during the first cycle of the triangle wave, and that magnitude of the output voltage command value of the second phase in a descending period of the triangle wave is smaller than the average of the output voltage command value of the second phase during the first cycle of the triangle wave, and the output voltage command value of the third phase is configured such that magnitude of the output voltage command value of the third phase in the ascending period of the triangle wave is smaller than an average of the output voltage command value of the third phase during the first cycle of the triangle wave, and that magnitude of the output voltage command value of the third phase in the descending period of the triangle wave is larger than the average of the output voltage command value of the third phase during the first cycle of the triangle wave, and during a second cycle of the two consecutive cycles of the triangle wave, the output voltage command value of the third phase is configured such that magnitude of the output voltage command value of the third phase in an ascending period of the triangle wave is larger than an average of the output voltage command value of the third phase during the second cycle of the triangle wave, and that magnitude of the output voltage command value of the third phase in a descending period of the triangle wave is smaller than the average of the output voltage command value of the third phase during the second cycle of the triangle wave, and the output voltage command value of the second phase is configured such that magnitude of the output voltage command value of the second phase in the ascending period of the triangle wave is smaller than an average of the output voltage command value of the second phase during the second cycle of the triangle wave, and that magnitude of the output voltage command value of the second phase in the descending period of the triangle wave is larger than the average of the output voltage command value of the second phase during the second cycle of the triangle wave.

According to another aspect of the present invention, a control method of a three-phase inverter is provided. The three-phase inverter includes three series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. The method for controlling the switching elements by using PWM pulses obtained by comparing output voltage command values of respective phases with a carrier includes a step of holding an AC output voltage of a first phase at a voltage of a positive electrode or a negative electrode of the DC voltage source for a predetermined time range equal to a cycle of the carrier, and a step of performing switching of the switching elements for second and third phases by using a PWM pulse for the second phase and a PWM pulse for the third phase, the PWM pulse for the second phase and the PWM pulse for the third phase being obtained by comparing an output voltage command value of the second phase and an output voltage command value of the third phase with the carrier respectively.

The method is characterized in that:
during consecutive two cycles of the carrier,
the AC output voltage of the first phase is held at the voltage of the positive electrode or the negative electrode of the DC voltage source,
the output voltage command value of the second phase is configured such that magnitude of the output voltage command value of the second phase in a first cycle of the carrier is larger than an average of the output voltage command value of the second phase during the two cycles of the carrier, and that magnitude of the output voltage command value of the second phase in a second cycle of the carrier is smaller than the average of the output voltage command value of the second phase, and
the output voltage command value of the third phase is configured such that magnitude of the output voltage command value of the third phase in the first cycle of the carrier is smaller than an average of the output voltage command value of the third phase during the two cycles of the carrier, and that magnitude of the output voltage command value of the third phase in the second cycle of the carrier is larger than the average of the output voltage command value of the third phase.

According to another aspect of the present invention, a control device of a three-phase inverter is provided. The three-phase inverter includes three series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. The control device is configured, in controlling the switching elements by using PWM pulses obtained by comparing output voltage command values of respective phases with a triangle wave, to hold an AC output voltage of a first phase at a voltage of a positive electrode or a negative electrode of the DC voltage source for a predetermined time range equal to a cycle of the triangle wave, and to control the switching elements for second and third phases by using a PWM pulse for the second phase and a PWM pulse for the third phase, the PWM pulse for the second phase and the PWM pulse for the third phase being obtained by comparing an output voltage command value of the second phase and an output voltage command value of the third phase with the triangle wave respectively.

The control device is characterized in that:
the output voltage command value of the second phase is configured such that magnitude of the output voltage command value of the second phase in an ascending period of the triangle wave is larger than an average of the output voltage command value of the second phase during the cycle of the triangle wave, and that magnitude of the output voltage command value of the second phase in a descending period of the triangle wave is smaller than the average of the output voltage command value of the second phase, and the output voltage command value of the third phase is configured such that magnitude of the output voltage command value of the third phase in the ascending period of the triangle wave is smaller than an average of the output voltage command value of the third phase during the cycle of the triangle wave, and that magnitude of the output voltage command value of the third phase in the descending period of the triangle wave is larger than the average of the output voltage command value of the third phase.

According to another aspect of the present invention, a control device of a three-phase inverter is provided. The three-phase inverter includes three series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. The control device is configured, in controlling the switching elements by using PWM pulses obtained by comparing output voltage command values of respective phases with a triangle wave, to hold an AC output voltage of a first phase at a voltage of a positive electrode or a negative electrode of the DC voltage source for a predetermined time range equal to a cycle of the triangle wave, and to control the switching elements for second and third phases by using a PWM pulse for the second phase and a PWM pulse for the third phase, the PWM pulse for the second phase and the PWM pulse for the third phase being obtained by comparing an output voltage command value of the second phase and an output voltage command value of the third phase with the triangle wave respectively.

The control device is characterized in that:

during a first cycle of two consecutive cycles of the triangle wave, the output voltage command value of the second phase is controlled such that magnitude of the output voltage command value of the second phase in an ascending period of the triangle wave is larger than an average of the output voltage command value of the second phase during the first cycle of the triangle wave, and that magnitude of the output voltage command value of the second phase in a descending period of the triangle wave is smaller than the average of the output voltage command value of the second phase during the first cycle of the triangle wave, and the output voltage command value of the third phase is controlled such that magnitude of the output voltage command value of the third phase in the ascending period of the triangle wave is smaller than an average of the output voltage command value of the third phase during the first cycle of the triangle wave, and that magnitude of the output voltage command value of the third phase in the descending period of the triangle wave is larger than the average of the output voltage command value of the third phase during the first cycle of the triangle wave, and during a second cycle of the two consecutive cycles of the triangle wave, the output voltage command value of the third phase is controlled such that magnitude of the output voltage command value of the third phase in an ascending period of the triangle wave is larger than an average of the output voltage command value of the third phase during the second cycle of the triangle wave, and that magnitude of the output voltage command value of the third phase in a descending period of the triangle wave is smaller than the average of the output voltage command value of the third phase during the second cycle of the triangle wave, and the output voltage command value of the second phase is controlled such that magnitude of the output voltage command value of the second phase in the ascending period of the triangle wave is smaller than an average of the output voltage command value of the second phase during the second cycle of the triangle wave, and that magnitude of the output voltage command value of the second phase in the descending period of the triangle wave is larger than the average of the output voltage command value of the second phase during the second cycle of the triangle wave.

According to another aspect of the present invention, a control device of a three-phase inverter is provided. The three-phase inverter includes three series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. The control device is configured, in controlling the switching elements by using PWM pulses obtained by comparing output voltage command values of respective phases with a triangle wave, to hold an AC output voltage of a first phase at a voltage of a positive electrode or a negative electrode of the DC voltage source for a predetermined time range equal to a cycle of the carrier, and to control the switching elements for second and third phases by using a PWM pulse for the second phase and a PWM pulse for the third phase, the PWM pulse for the second phase and the PWM pulse for the third phase being obtained by comparing an output voltage command value of the second phase and an output voltage command value of the third phase with the carrier respectively.

The control device is characterized in that:

during consecutive two cycles of the carrier, the AC output voltage of the first phase is held at the voltage of the positive electrode or the negative electrode of the DC voltage source, the output voltage command value of the second phase is controlled such that magnitude of the output voltage command value of the second phase in a first cycle of the carrier is larger than an average of the output voltage command value of the second phase during the two cycles of the carrier, and that magnitude of the output voltage command value of the second phase in a second cycle of the carrier is smaller than the average of the output voltage command value of the second phase, and the output voltage command value of the third phase is controlled such that magnitude of the output voltage command value of the third phase in the first cycle of the carrier is smaller than an average of the output voltage command value of the third phase during the two cycles of the carrier, and that magnitude of the output voltage command value of the third phase in the second cycle of the carrier is larger than the average of the output voltage command value of the third phase.

According to another aspect of the present invention, a three-phase inverter includes three series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. The three-phase inverter is configured, in controlling the switching elements by using PWM pulses obtained by comparing output voltage command values of respective phases with a triangle wave, to hold an AC output voltage of a first phase at a voltage of a positive electrode or a negative electrode of the DC voltage source for a predetermined time range equal to a cycle of the triangle wave, and to control the switching elements for second and third phases by using a PWM pulse for the second phase and a PWM pulse for the third phase, the PWM pulse for the second phase and the PWM pulse for the third phase being obtained by comparing an output voltage command value of the second phase and an output voltage command value of the third phase with the triangle wave respectively.

The three-phase inverter is characterized in that:

the output voltage command value of the second phase is configured such that magnitude of the output voltage command value of the second phase in an ascending period of the triangle wave is larger than an average of the output voltage command value of the second phase during the cycle of the triangle wave, and that magnitude of the output voltage command value of the second phase in a descending period of the triangle wave is smaller than the average of the output voltage command value of the second phase, and the output voltage command value of the third phase is configured such that magnitude of the output voltage command value of the third phase in the ascending period of the triangle wave is smaller than an average of the output voltage command value of the third phase during the cycle of the triangle wave, and that magnitude of the output voltage command value of the third phase in the descending period of the triangle wave is larger than the average of the output voltage command value of the third phase.

The output voltage command value of the second phase may be set to zero or a minimum value during the descending period of the triangle wave, and the output voltage command value of the third phase may be set to zero or a minimum value during the ascending period of the triangle wave.

According to another aspect of the present invention, a three-phase inverter includes three series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. The three-phase inverter is configured, in controlling the switching elements by using PWM pulses obtained by comparing output voltage command values of respective phases with a triangle wave, to hold an AC output voltage of a first phase at a voltage of a positive electrode or a negative electrode of the DC voltage source for a predetermined time range equal to a cycle of the triangle wave, and to control the switching elements for second and third phases by using a PWM pulse for the second phase and a PWM pulse for the third phase, the PWM pulse for the second phase and the PWM pulse for the third phase being obtained by comparing an output voltage command value of the second phase and an output voltage command value of the third phase with the triangle wave respectively.

The three-phase inverter is characterized in that:

during a first cycle of two consecutive cycles of the triangle wave, the output voltage command value of the second phase is configured such that magnitude of the output voltage command value of the second phase in an ascending period of the triangle wave is larger than an average of the output voltage command value of the second phase during the first cycle of the triangle wave, and that magnitude of the output voltage command value of the second phase in a descending period of the triangle wave is smaller than the average of the output voltage command value of the second phase during the first cycle of the triangle wave, and the output voltage command value of the third phase is configured such that magnitude of the output voltage command value of the third phase in the ascending period of the triangle wave is smaller than an average of the output voltage command value of the third phase during the first cycle of the triangle wave, and that magnitude of the output voltage command value of the third phase in the descending period of the triangle wave is larger than the average of the output voltage command value of the third phase during the first cycle of the triangle wave, and during a second cycle of the two consecutive cycles of the triangle wave, the output voltage command value of the third phase is controlled such that magnitude of the output voltage command value of the third phase in an ascending period of the triangle wave is larger than an average of the output voltage command value of the third phase during the second cycle of the triangle wave, and that magnitude of the output voltage command value of the third phase in a descending period of the triangle wave is smaller than the average of the output voltage command value of the third phase during the second cycle of the triangle wave, and the output voltage command value of the second phase is controlled such that magnitude of the output voltage command value of the second phase in the ascending period of the triangle wave is smaller than an average of the output voltage command value of the second phase during the second cycle of the triangle wave, and that magnitude of the output voltage command value of the second phase in the descending period of the triangle wave is larger than the average of the output voltage command value of the second phase during the second cycle of the triangle wave.

According to another aspect of the present invention, a three-phase inverter includes three series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. The three-phase inverter is configured, in controlling the switching elements by using PWM pulses obtained by comparing output voltage command values of respective phases with a carrier, to hold an AC output voltage of a first phase at a voltage of a positive electrode or a negative electrode of the DC voltage source for a predetermined time range equal to a cycle of the carrier, and to control the switching elements for second and third phases by using a PWM pulse for the second phase and a PWM pulse for the third phase, the PWM pulse for the second phase and the PWM pulse for the third phase being obtained by comparing an output voltage command value of the second phase and an output voltage command value of the third phase with the carrier respectively.

The three-phase inverter is characterized in that:

during consecutive two cycles of the carrier, the AC output voltage of the first phase is held at the voltage of the positive electrode or the negative electrode of the DC voltage source, the output voltage command value of the second phase is configured such that magnitude of the output voltage command value of the second phase in a first cycle of the carrier is larger than an average of the output voltage command value of the second phase during the two cycles of the carrier, and that magnitude of the output voltage command value of the second phase in a second cycle of the carrier is smaller than the average of the output voltage command value of the second phase, and the output voltage command value of the third phase is configured such that magnitude of the output voltage command value of the third phase in the first cycle of the carrier is smaller than an average of the output voltage command value of the third phase during the two cycles of the carrier, and that magnitude of the output voltage command value of the third phase in the second cycle of the carrier is larger than the average of the output voltage command value of the third phase.

The output voltage command value of the second phase may be set to zero or a minimum value during the second cycle of the triangle wave, and the output voltage command value of the third phase may be set to zero or a minimum value during the first cycle of the triangle wave. The carrier may be a triangle wave.

According to another aspect of the present invention, a control method of a three-phase inverter is provided. The three-phase inverter includes three series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. In the method, the semiconductor switching elements are controlled by using PWM pulses obtained by comparing voltage command values of respective phases with a carrier.

The method is characterized in that:
for each phase, the voltage command value is determined for each of a predetermined period within a cycle of the carrier and a remaining period within the cycle of the carrier,
the voltage command value for the predetermined period and the voltage command value for the remaining period are increased or decreased from an original voltage command value used for causing the three-phase inverter to output a target voltage, such that a time average value of the voltage command value becomes equal to the original voltage command value, and
magnitude of the voltage command value is expressed by following formula,
when the increased voltage command value of each phase is denoted as $D_{UA}$, $D_{VA}$, and $D_{WA}$,
the decreased voltage command value of each phase is denoted as $D_{UB}$, $D_{VB}$, and $D_{WB}$,
the original voltage command value of each phase is denoted as $D_U$, $D_V$, and $D_W$, and
a selectable ratio defined for the voltage command value of each phase is denoted as $A_U$, $A_V$, and $A_W$, wherein $D_{UA}=A_U \cdot D_U$ (if $1 \leq A_U \cdot D_U$, $D_{UA}=1$)

$D_{UB}=2D_U-D_{UA}$ $D_{VA}=A_V \cdot D_V$ (if $1 \leq A_V \cdot D_V$, $D_{VA}=1$)

$D_{VB}=2D_V-D_{VA}$ $D_{WA}=A_W \cdot D_W$ (if $1 \leq A_W \cdot D_W$, $D_{WA}=1$)

$D_{WB}=2D_W-D_{WA}$ wherein the carrier is not less than 0 and not more than 1, and $0 \leq D_U$, $D_V$, $D_W \leq 1$.

According to another aspect of the present invention, a control device of a three-phase inverter is provided. The three-phase inverter includes three series circuits each of which is formed by two semiconductor switching elements being connected in series. The series circuits are connected in parallel with each other with respect to a capacitor connected in parallel with a direct-current (DC) voltage source, and a connection point between the two semiconductor switching elements is used as one of output terminals of three-phase alternate-current (AC) electrical power. The control device includes a voltage command value generator for generating a voltage command value of each phase, a comparator for generating PWM pulses to actuate the semiconductor switching elements by comparing a carrier with a voltage command value of each phase generated by the voltage command value generator, and a distributer for generating actuation pulses to actuate all the semiconductor switching elements based on the PWM pulses. The control device is configured to change a time ratio of a voltage of the DC voltage source output to the output terminals by performing on/off operations of the semiconductor switching elements, in order to cause to output three-phase AC voltage of desired magnitude and desired frequency.

The control device is characterized in that:
for each phase, the voltage command value is determined for each of a predetermined period within a cycle of the carrier and a remaining period within the cycle of the carrier,
the voltage command value for the predetermined period and the voltage command value for the remaining period are increased or decreased from an original voltage command value used for causing the three-phase inverter to output a target voltage, such that a time average value of the voltage command value becomes equal to the original voltage command value, and
magnitude of the voltage command value is expressed by following formula,
when the increased voltage command value of each phase, generated by the voltage command value generator, is denoted as $D_{UA}$, $D_{VA}$, and $D_{WA}$,
the decreased voltage command value of each phase, generated by the voltage command value generator, is denoted as $D_{UA}$, $D_{VB}$, and $D_{WB}$,
the original voltage command value of each phase is denoted as $D_U$, $D_V$, and $D_W$, and
a selectable ratio defined for the voltage command value of each phase is denoted as $A_U$, $A_V$, and $A_W$, wherein $D_{UA}=A_U \cdot D_U$ (if $1 \leq A_U \cdot D_U$, $D_{UA}=1$)

$D_{UB}=2D_U-D_{UA}$ $D_{VA}=A_V \cdot D_V$ (if $1 \leq A_V \cdot D_V$, $D_{VA}=1$)

$D_{VB}=2D_V-D_{VA}$ $D_{WA}=A_W \cdot D_W$ (if $1 \leq A_W \cdot D_W$, $D_{WA}=1$)

$D_{WB}=2D_W-D_{WA}$ wherein the carrier is not less than 0 and not more than 1, and $0 \leq D_U$, $D_V$, $D_W \leq 1$.

According to another aspect of the present invention, a three-phase inverter includes a main circuit of the three-phase inverter and a control device. The main circuit of the three-phase inverter includes three series circuits each of which is formed by two semiconductor switching elements being connected in series. The series circuits are connected in parallel with each other with respect to a capacitor connected in parallel with a direct-current (DC) voltage source, and a connection point between the two semiconductor switching elements is used as one of output terminals of three-phase alternate-current (AC) electrical power. The control device includes a voltage command value generator for generating a voltage command value of each phase, a comparator for generating PWM pulses to actuate the semiconductor switching elements by comparing a carrier with a voltage command value of each phase generated by the voltage command value generator, and a distributer for generating actuation pulses to actuate all the semiconductor switching elements based on the PWM pulses. The control device is configured to change a time ratio of a voltage of the DC voltage source output to the output terminals by performing on/off operations of the semiconductor switching elements, in order to cause to output three-phase AC voltage of desired magnitude and desired frequency.

The three-phase inverter is characterized in that: for each phase, the voltage command value is determined for each of a predetermined period within a cycle of the carrier and a remaining period within the cycle of the carrier, the voltage command value for the predetermined period and the voltage command value for the remaining period are increased or decreased from an original voltage command value used for causing the three-phase inverter to output a target voltage, such that a time average value of the voltage command value becomes equal to the original voltage command value, and magnitude of the voltage command value is expressed by following formula, when the increased voltage command value of each phase is denoted as $D_{UA}$, $D_{VA}$, and $D_{WA}$, the decreased voltage command value of each phase is denoted as $D_{UB}$, $D_{VB}$, and $D_{WB}$, the original voltage command value of each phase is denoted as $D_U$, $D_V$, and $D_W$, and a selectable ratio defined for the voltage command value of each phase is denoted as $A_U$, $A_V$, and $A_W$, wherein $D_{UA} = A_U \cdot D_U$ (if $1 \leq A_U \cdot D_U$, $D_{UA}=1$)

$D_{UB} = 2D_U - D_{UA}$ $D_{VA} = A_V \cdot D_V$ (if $1 \leq A_V \cdot D_V$, $D_{VA}=1$)

$D_{VB} = 2D_V - D_{VA}$ $D_{WA} = A_W \cdot D_W$ (if $1 \leq A_W \cdot D_W$, $D_{WA}=1$)

$D_{WB} = 2D_W - D_{WA}$ wherein the carrier is not less than 0 and not more than 1, and $0 \leq D_U, D_V, D_W \leq 1$.

According to another aspect of the present invention, a control method of a three-phase inverter is provided. The three-phase inverter includes three series circuits each of which is formed by two semiconductor switching elements being connected in series. The series circuits are connected in parallel with each other with respect to a capacitor connected in parallel with a direct-current voltage source, and a connection point between the two semiconductor switching elements is used as one of output terminals of three-phase alternate-current (AC) electrical power. In the method, the switching elements are controlled by using PWM pulses obtained by comparing output voltage command values of respective phases with a carrier.

The method is characterized in that:

a voltage command value of a first phase among at least two phases is configured such that an output voltage during a predetermined time range in a cycle of the carrier is not less than a time average of a target voltage to be output in the cycle of the carrier, and that the output voltage during a remaining time range in the cycle of the carrier is less than the time average of the target voltage, a voltage command value of a second phase is configured such that an output voltage during the predetermined time range in the cycle of the carrier is less than a time average of a target voltage to be output in the cycle of the carrier, and that the output voltage during the remaining time range in the cycle of the carrier is not less than the time average of the target voltage, the voltage command value of the first phase with respect to the cycle is equal to a time average of a target voltage of the first phase, and the voltage command value of the second phase with respect to the cycle is equal to a time average of a target voltage of the second phase.

With respect to a command value ratio which is a ratio of the voltage command value in the predetermined time range or the remaining time range to the target voltage, a command value ratio for the first phase may be equal to a command value ratio for the second phase, or may be different from a command value ratio for the second phase.

The method may further include a step of changing between a first mode and a second mode.

The first mode is a mode in which the voltage command value of the first phase is configured such that the output voltage during the predetermined time range in the cycle of the carrier is not less than the time average of the target voltage to be output in the cycle of the carrier, and that the output voltage during the remaining time range in the cycle of the carrier is less than the time average of the target voltage, and in which the voltage command value of the second phase is configured such that the output voltage during the predetermined time range in the cycle of the carrier is less than the time average of the target voltage to be output in the cycle of the carrier, and that the output voltage during the remaining time range in the cycle of the carrier is not less than the time average of the target voltage.

The second mode is a mode in which the voltage command value of the first phase and the voltage command value of the second phase are configured such that the output voltage during the predetermined time range in the cycle of the carrier is not less than the time average of the target voltage to be output in the cycle of the carrier, and that the output voltage during the remaining time range in the cycle of the carrier is less than the time average of the target voltage.

The command value ratio may be changed in accordance with an output voltage of each phase, a phase angle of the output voltage of each phase, or a phase angle of the output current of each phase.

According to another aspect of the present invention, a control device of a three-phase inverter is provided. The three-phase inverter includes three series circuits each of which is formed by two semiconductor switching elements being connected in series. The series circuits are connected in parallel with each other with respect to a capacitor connected in parallel with a direct-current (DC) voltage source, and a connection point between the two semiconductor switching elements is used as one of output terminals of three-phase alternate-current (AC) electrical power. The control device includes a voltage command value generator for generating a voltage command value of each phase, a comparator for generating PWM pulses to actuate the switching elements by comparing a carrier with a voltage command value of each phase generated by the voltage command value generator, and a distributer for generating actuation pulses for all the switching elements based on the PWM pulses. The control device is configured to change a time ratio of a voltage of the DC voltage source output to the output terminals by performing on/off operations of the switching elements, in order to cause to output three-phase AC voltage of desired magnitude and desired frequency.

The control device is characterized in that:

the voltage command value generator is configured to output a voltage command value of a first phase among at least two phases and a voltage command value of a second phase such that the voltage command value of the first phase is configured such that an output voltage during a predetermined time range in a cycle of the carrier is not less than a time average of a target voltage to be output in the cycle of the carrier, and that the output voltage during a remaining time range in the cycle of the carrier is less than the time average of the target voltage, the voltage command value of the second phase is configured such that an output voltage during the predetermined time range in the cycle of the carrier is less than a time average of a target voltage to be output in the cycle of the carrier, and that the output voltage during the remaining time range in the cycle of the carrier is not less than the time average of the target voltage, the voltage command value of the first phase with respect to the cycle is equal to a time average of a target voltage of the first phase, and the voltage command value of the second phase with respect to the cycle is equal to a time average of a target voltage of the second phase.

According to another aspect of the present invention, a three-phase inverter includes a main circuit of the three-phase inverter and a control device. The main circuit of the three-phase inverter includes three series circuits each of which is formed by two semiconductor switching elements being connected in series. The series circuits are connected in parallel with each other with respect to a capacitor connected in parallel with a direct-current (DC) voltage source, and a connection point between the two semiconductor switching elements is used as one of output terminals of three-phase alternate-current (AC) electrical power. The control device includes a voltage command value generator for generating a voltage command value of each phase, a comparator for generating PWM pulses to actuate the switching elements by comparing a carrier with a voltage command value of each phase generated by the voltage command value generator, and a distributer for generating actuation pulses to actuate all the switching elements based on the PWM pulses. The control device is configured to change a time ratio of a voltage of the DC voltage source output to the output terminals by performing on/off operations of the switching elements, in order to cause to output three-phase AC voltage of desired magnitude and desired frequency.

The three-phase inverter is characterized in that:

the voltage command value generator is configured to output a voltage command value of a first phase among at least two phases and a voltage command value of a second phase such that the voltage command value of the first phase is configured such that an output voltage during a predetermined time range in a cycle of the carrier is not less than a time average of a target voltage to be output in the cycle of the carrier, and that the output voltage during a remaining time range in the cycle of the carrier is less than the time average of the target voltage, the voltage command value of the second phase is configured such that an output voltage during the predetermined time range in the cycle of the carrier is less than a time average of a target voltage to be output in the cycle of the carrier, and that the output voltage during the remaining time range in the cycle of the carrier is not less than the time average of the target voltage, the voltage command value of the first phase with respect to the cycle is equal to a time average of a target voltage of the first phase, and the voltage command value of the second phase with respect to the cycle is equal to a time average of a target voltage of the second phase.

According to the present invention, modified PWM pulses are generated by comparing output voltage command value of each phase with a single carrier generated by a counter common to each phase, and an inverter is controlled by using the modified PWM pulses. Thus, a ripple current component of a capacitor can be reduced and heat generation of a capacitor can be prevented, while outputting a target voltage from the inverter.

Further, according to the present invention, multiple types of carriers are not required, or a complex calculation process for realizing a space vector control method is not required. Thus, as the method can be embodied by a general purpose microcontroller, it is possible to reduce cost and size of an entire device, including a control device and a cooling means.

Further, it is possible to prevent a specific switching element from being overheated, or to avoid increase of noise, each of which tends to occur in the conventional two-phase modulation.

What is claimed is:

1. A method of controlling an inverter including a plurality of series circuits, each of the series circuits being formed by two semiconductor switching elements being connected in series, a connection point between the two semiconductor switching elements being used as one of output terminals of polyphase alternate-current (AC) electrical power, the series circuits being connected in parallel with each other with respect to a capacitor connected in parallel with a direct-current (DC) voltage source, the method for controlling the semiconductor switching elements by using PWM pulses obtained by comparing output voltage command values of respective phases with a carrier comprising:

generating modified PWM pulses of respective phases based on an output of a counter common to the respective phases; and controlling the semiconductor switching elements by using the modified PWM pulses, wherein each of the modified PWM pulses is configured such that, in a period corresponding to one or more cycles of the carrier, a sum of one or more ON periods of the modified PWM pulse is substantially equal to a sum of one or more ON periods of a PWM pulse of a corresponding phase among the respective phases, the PWM pulse being obtained by comparing a voltage command value with the carrier, and at least one of a generation timing and a generation frequency of the ON periods of at least one of the modified PWM pulses is different from the PWM pulse, exceeding a necessary extent for control.

2. The method according to claim 1, wherein the carrier is a triangle wave or a sawtooth wave.

3. The method according to claim 1, wherein the inverter is a three-phase inverter including the three series circuits, and in the generating of the modified PWM pulses, in a case in which the modified PWM pulses of the period corresponding to one or more cycles of the carrier is to be generated,
  a modified PWM pulse for a first phase for controlling the semiconductor switching elements so as to hold an AC output voltage of the first phase at a voltage of a positive electrode or a negative electrode of the DC voltage source is generated,
  a converted voltage command value for a second phase is used for generating a modified PWM pulse for the second phase in which at least one of the generation timing and the generation frequency is changed from the PWM pulse, and
  a converted voltage command value for a third phase is used for generating a modified PWM pulse for the third phase in which at least one of the generation timing and the generation frequency is changed from the PWM pulse.

4. The method according to claim 1, wherein
the inverter is a three-phase inverter including the three series circuits; and
in the generating of the modified PWM pulses, a converted voltage command value for a predetermined period within a cycle of the carrier and a converted voltage command value for a remaining period within the cycle of the carrier are used for each phase as the output voltage command value, the converted voltage command value for the predetermined period and the converted voltage command value for the remaining period being generated by increasing or decreasing an original voltage command value used for causing the three-phase inverter to output a target voltage, such that a time average value of the converted voltage command value during the cycle of the carrier becomes equal to the original voltage command value; wherein
  in a case in which magnitude of the carrier is not less than 0 and not more than 1, the converted voltage command values of respective three phases ($D_{UA}$, $D_{VA}$, and $D_{WA}$) generated by increasing the original voltage command values and the converted voltage command values of the respective three phases ($D_{UB}$, $D_{VB}$, and $D_{WB}$) generated by decreasing the original voltage command values are expressed by following formulas:

$$D_{UA} = A_U \cdot D_U \text{ (if } 1 \leq A_U \cdot D_U, D_{UA} = 1\text{)}$$

$$D_{UB} = 2D_U - D_{UA}$$

$$D_{VA} = A_V \cdot D_V \text{ (if } 1 \leq A_V \cdot D_V, D_{VA} = 1\text{)}$$

$$D_{VB} = 2D_V - D_{VA}$$

$$D_{WA} = A_W \cdot D_W \text{ (if } 1 \leq A_W \cdot D_W, D_{WA} = 1\text{)}$$

$$D_{WB} = 2D_W - D_{WA}$$

wherein $D_U$, $D_V$, and $D_W$ are the original voltage command values of the respective three phases,
  $A_U$, $A_V$, and $A_W$ are selectable ratios defined for the respective three phases,
  and $0 \leq D_U, D_V, D_W \leq 1$.

5. The method according to claim 1, further comprising:
generating the carrier by using the counter;
receiving, as original voltage command values, inputs of the voltage command values of the respective phases, each of the voltage command values being used for causing the inverter to output a target voltage to a corresponding output terminal of the output terminals;
generating converted voltage command values of the respective phases by converting the received original voltage command values of the respective phases, at least one of the converted voltage command values being generated by increasing a corresponding original voltage command value of the received original voltage command values in a part of a period corresponding to one or more cycles of the carrier, and by decreasing the corresponding original voltage command value in a remaining part of the period corresponding to one or more cycles of the carrier; and
generating the modified PWM pulses of the respective phases by comparing the converted voltage command values with the carrier, wherein
in the generating of the converted voltage command values, in a case in which magnitude of the carrier is not less than 0 and not more than 1, a converted voltage command value (Dc1) of one of the phases and a converted voltage command value (Dc2) of another one of the phases during a period (T) corresponding to one or more cycles of the carrier are generated such that following conditions (a) to (d) are satisfied,
(a) during a predetermined time range (t) within the period T (0<t<T), Dc1 is greater than D1 and Dc2 is smaller than D2,
(b) during a remaining time range of the period T, Dc1 is smaller than D1 and Dc2 is greater than D2,
(c) a length of time in which a modified PWM pulse generated from Dc1 is ON, during the period T, is equal to D1×T, and
(d) a length of time in which a modified PWM pulse generated from Dc2 is ON, during the period T, is equal to D2×T,
where D1 is an original voltage command value of the one of the phases during the period T ($0 \leq D1 \leq 1$), and D2 is an original voltage command value of said another one of the phases during the period T ($0 \leq D2 \leq 1$).

6. The method according to claim 3, wherein
the carrier is a triangle wave,
the converted voltage command value for the second phase is configured such that magnitude of the converted voltage command value for the second phase in an ascending period of a cycle of the triangle wave is larger than an average of the output voltage command value of the second phase during the cycle of the triangle wave, and that magnitude of the converted voltage command value for the second phase in a descending period of the cycle of the triangle wave is smaller than the average of the output voltage command value of the second phase, and
the converted voltage command value for the third phase is configured such that magnitude of the converted voltage command value for the third phase in the ascending period of the cycle of the triangle wave is smaller than an average of the output voltage command value of the third phase during the cycle of the triangle wave, and that magnitude of the converted voltage command value for the third phase in the descending period of the cycle of the triangle wave is larger than the average of the output voltage command value of the third phase.

7. The method according to claim 3, wherein
the carrier is a triangle wave;
the converted voltage command value for the second phase is configured such that, during a first cycle of two consecutive cycles of the triangle wave,
  magnitude of the converted voltage command value for the second phase in an ascending period of the triangle wave is larger than an average of the output voltage command value of the second phase during the first cycle of the triangle wave, and
  magnitude of the converted voltage command value for the second phase in a descending period of the triangle wave is smaller than the average of the output voltage command value of the second phase during the first cycle of the triangle wave, and
during a second cycle of the two consecutive cycles of the triangle wave,
  magnitude of the converted voltage command value for the second phase in the ascending period of the triangle wave is smaller than an average of the output voltage command value of the second phase during the second cycle of the triangle wave, and
  magnitude of the converted voltage command value for the second phase in the descending period of the triangle wave is larger than the average of the output voltage command value of the second phase during the second cycle of the triangle wave; and
the converted voltage command value for the third phase is configured such that,
during the first cycle,
  magnitude of the converted voltage command value for the third phase in the ascending period of the triangle wave is smaller than an average of the output voltage command value of the third phase during the first cycle of the triangle wave, and
  magnitude of the converted voltage command value for the third phase in the descending period of the triangle wave is larger than the average of the output voltage command value of the third phase during the first cycle of the triangle wave, and
during the second cycle,
  magnitude of the converted voltage command value for the third phase in the ascending period of the triangle wave is larger than an average of the output voltage command value of the third phase during the second cycle of the triangle wave, and
  magnitude of the converted voltage command value for the third phase in the descending period of the triangle wave is smaller than the average of the output voltage command value of the third phase during the second cycle of the triangle wave.

8. The method according to claim 3, wherein
during consecutive two cycles of the carrier,
  the converted voltage command value for the second phase is configured such that magnitude of the converted voltage command value for the second phase in a first cycle of the carrier is larger than an average of the output voltage command value of the second phase during the two cycles of the carrier, and that magnitude of the converted voltage command value for the second phase in a second cycle of the carrier is smaller than the average of the output voltage command value of the second phase, and
  the converted voltage command value for the third phase is configured such that magnitude of the converted voltage command value for the third phase in the first cycle of the carrier is smaller than an average of the output voltage command value of the third phase during the two cycles of the carrier, and that magnitude of the converted voltage command value for the third phase in the second cycle of the carrier is larger than the average of the output voltage command value of the third phase.

9. The method according to claim 4, wherein
the converted voltage command value of a first phase of at least two phases among the respective three phases is configured such that an output voltage of the first phase during the predetermined period is not less than a time average of a target voltage of the first phase to be output in the cycle of the carrier, and that the output voltage of the first phase during the remaining period is less than the time average of the target voltage of the first phase, and
the converted voltage command value of a second phase of the at least two phases is configured such that an output voltage of the second phase during the predetermined period is less than a time average of a target voltage of the second phase to be output in the cycle of the carrier, and that the output voltage of the second phase during the remaining period is not less than the time average of the target voltage of the second phase.

10. The method according to claim 9, wherein, with respect to a command value ratio which is a ratio of the converted voltage command value in the predetermined time range or the remaining time range to the original voltage command value, a command value ratio for the first phase is equal to a command value ratio for the second phase.

11. The method according to claim 9, wherein, with respect to a command value ratio which is a ratio of the converted voltage command value in the predetermined time range or the remaining time range to the original voltage command value, a command value ratio for the first phase is different from a command value ratio for the second phase.

12. The method according to claim 10,
  wherein the command value ratio is changed in accordance with an output voltage of each phase, a phase angle of the output voltage of each phase, or a phase angle of an output current of each phase.

13. The method according to claim 11, further comprising changing between a first mode and a second mode;
  the first mode being a mode in which the converted voltage command value of the first phase is configured such that the output voltage of the first phase during the predetermined period is not less than the time average of the target voltage of the first phase to be output in the cycle of the carrier, and that the output voltage of the first phase during the remaining period is less than the time average of the target voltage of the first phase, and in which the converted voltage command value of the second phase is configured such that the output voltage of the second phase during the predetermined period is less than the time average of the target voltage of the second phase to be output in the cycle of the carrier, and that the output voltage of the second phase during the remaining period is not less than the time average of the target voltage of the second phase, and
  the second mode being a mode in which the converted voltage command value of the first phase and the converted voltage command value of the second phase are configured such that the output voltages of the first and second phases during the predetermined period are not less than the time averages of the target voltages of the first and second phases to be output in the cycle of the carrier respectively, and that the output voltages of the first and second phases during the remaining period are less than the time averages of the target voltages of the first and second phases respectively.

14. The method according to claim 11,
wherein the command value ratio is changed in accordance with an output voltage of each phase, a phase angle of the output voltage of each phase, or a phase angle of an output current of each phase.

15. A control device of an inverter comprising a plurality of series circuits, each of the series circuits being formed by two semiconductor switching elements being connected in series, a connection point between the two semiconductor switching elements being used as one of output terminals of polyphase alternate-current (AC) electrical power, the series circuits being connected in parallel with each other with respect to a capacitor connected in parallel with a direct-current (DC) voltage source,
the control device being configured, in generating PWM pulses for controlling the semiconductor switching elements by comparing output voltage command values of respective phases with a carrier,
to generate modified PWM pulses of respective phases based on an output of a counter common to the respective phases; and
to control the semiconductor switching elements by using the modified PWM pulses,
wherein each of the modified PWM pulses is configured such that, in a period corresponding to one or more cycles of the carrier, a sum of one or more ON periods of the modified PWM pulse is substantially equal to a sum of one or more ON periods of a PWM pulse of a corresponding phase among the respective phases, the PWM pulse being obtained by comparing a voltage command value with the carrier, and
at least one of a generation timing and a generation frequency of the ON periods of at least one of the modified PWM pulses is different from the PWM pulse, exceeding a necessary extent for control.

16. The control device according to claim 15, wherein the inverter is a three-phase inverter including the three series circuits, and
the control device is configured, in a case in which the modified PWM pulses of the period corresponding to one or more cycles of the carrier is to be generated,
to generate a modified PWM pulse for a first phase for controlling the semiconductor switching elements so as to hold an AC output voltage of the first phase at a voltage of a positive electrode or a negative electrode of the DC voltage source,
to use a converted voltage command value for a second phase for generating a modified PWM pulse for the second phase in which at least one of the generation timing and the generation frequency is changed from the PWM pulse, and
to use a converted voltage command value for a third phase for generating a modified PWM pulse for the third phase in which at least one of the generation timing and the generation frequency is changed from the PWM pulse.

17. The control device according to claim 15, the inverter being a three-phase inverter including the three series circuits, and the control device including a voltage command value generator for generating the output voltage command value of each phase, a comparator for generating the modified PWM pulses by comparing the carrier with the output voltage command value of each phase, and a distributer for generating actuation pulses to actuate all the semiconductor switching elements based on the PWM pulses;
wherein the comparator is configured to use, for each phase, a converted voltage command value for a predetermined period within a cycle of the carrier and a converted voltage command value for a remaining period within the cycle of the carrier as the output voltage command value; and
the voltage command value generator is configured to generate the converted voltage command value for the predetermined period and the converted voltage command value for the remaining period by increasing or decreasing an original voltage command value used for causing the three-phase inverter to output a target voltage, such that a time average value of the converted voltage command value during the cycle of the carrier becomes equal to the original voltage command value,
wherein
in a case in which magnitude of the carrier is not less than 0 and not more than 1, the converted voltage command values of respective three phases ($D_{UA}$, $D_{VA}$, and $D_{WA}$) generated by increasing the original voltage command values and the converted voltage command values of the respective three phases ($D_{UB}$, $D_{VB}$, and $D_{WB}$) generated by decreasing the original voltage command values are expressed by following formulas:

$$D_{UA}=A_U \cdot D_U \text{ (if } 1 \leq A_U \cdot D_U, D_{UA}=1)$$

$$D_{UB}=2D_U-D_{UA}$$

$$D_{VA}=A_V \cdot D_V \text{ (if } 1 \leq A_V \cdot D_V, D_{VA}=1)$$

$$D_{VB}=2D_V-D_{VA}$$

$$D_{WA}=A_W \cdot D_W \text{ (if } 1 \leq A_W \cdot D_W, D_{WA}=1)$$

$$D_{WB}=2D_W-D_{WA}$$

wherein $D_U$, $D_V$, and $D_W$ are the original voltage command values of the respective three phases,
$A_U$, $A_V$, and $A_W$ are selectable ratios defined for the respective three phases,
and $0 \leq D_U, D_V, D_W \leq 1$.

18. The control device according to claim 16, wherein the carrier is a triangle wave,
the converted voltage command value for the second phase is configured such that magnitude of the converted voltage command value for the second phase in an ascending period of a cycle of the triangle wave is larger than an average of the output voltage command value of the second phase during the cycle of the triangle wave, and that magnitude of the converted voltage command value for the second phase in a descending period of the cycle of the triangle wave is smaller than the average of the output voltage command value of the second phase, and
the converted voltage command value for the third phase is configured such that magnitude of the converted voltage command value for the third phase in the ascending period of the cycle of the triangle wave is smaller than an average of the output voltage command value of the third phase during the cycle of the triangle wave, and that magnitude of the converted voltage command value for the third phase in the descending period of the cycle of the triangle wave is larger than the average of the output voltage command value of the third phase.

19. The control device according to claim 16, wherein
the carrier is a triangle wave;
the converted voltage command value for the second phase is configured such that,
during a first cycle of two consecutive cycles of the triangle wave,
magnitude of the converted voltage command value for the second phase in an ascending period of the triangle wave is larger than an average of the output voltage command value of the second phase during the first cycle of the triangle wave, and
magnitude of the converted voltage command value for the second phase in a descending period of the triangle wave is smaller than the average of the output voltage command value of the second phase during the first cycle of the triangle wave, and
during a second cycle of the two consecutive cycles of the triangle wave,
magnitude of the converted voltage command value for the second phase in the ascending period of the triangle wave is smaller than an average of the output voltage command value of the second phase during the second cycle of the triangle wave, and
magnitude of the converted voltage command value for the second phase in the descending period of the triangle wave is larger than the average of the output voltage command value of the second phase during the second cycle of the triangle wave; and
the converted voltage command value for the third phase is configured such that,
during the first cycle,
magnitude of the converted voltage command value for the third phase in the ascending period of the triangle wave is smaller than an average of the output voltage command value of the third phase during the first cycle of the triangle wave, and
magnitude of the converted voltage command value for the third phase in the descending period of the triangle wave is larger than the average of the output voltage command value of the third phase during the first cycle of the triangle wave, and
during the second cycle,
magnitude of the converted voltage command value for the third phase in the ascending period of the triangle wave is larger than an average of the output voltage command value of the third phase during the second cycle of the triangle wave, and
magnitude of the converted voltage command value for the third phase in the descending period of the triangle wave is smaller than the average of the output voltage command value of the third phase during the second cycle of the triangle wave.

20. The control device according to claim 16, wherein
during consecutive two cycles of the carrier,
the converted voltage command value for the second phase is configured such that magnitude of the converted voltage command value for the second phase in a first cycle of the carrier is larger than an average of the output voltage command value of the second phase during the two cycles of the carrier, and that magnitude of the converted voltage command value for the second phase in a second cycle of the carrier is smaller than the average of the output voltage command value of the second phase, and
the converted voltage command value for the third phase is configured such that magnitude of the converted voltage command value for the third phase in the first cycle of the carrier is smaller than an average of the output voltage command value of the third phase during the two cycles of the carrier, and that magnitude of the converted voltage command value for the third phase in the second cycle of the carrier is larger than the average of the output voltage command value of the third phase.

21. The control device according to claim 17, wherein
the converted voltage command value of a first phase of at least two phases among the respective three phases, which is generated by the voltage command value generator, is configured such that an output voltage of the first phase during the predetermined period is not less than a time average of a target voltage of the first phase to be output in the cycle of the carrier, and that the output voltage of the first phase during the remaining period is less than the time average of the target voltage of the first phase, and
the converted voltage command value of a second phase of the at least two phases, which is generated by the voltage command value generator, is configured such that an output voltage of the second phase during the predetermined period is less than a time average of a target voltage of the second phase to be output in the cycle of the carrier, and that the output voltage of the second phase during the remaining period is not less than the time average of the target voltage of the second phase.

22. The control device according to claim 18, wherein the converted voltage command value for the second phase is set to zero or a minimum value during the descending period of the triangle wave, and the converted voltage command value for the third phase is set to zero or a minimum value during the ascending period of the triangle wave.

23. The control device according to claim 20, wherein the converted voltage command value for the second phase is set to zero or a minimum value during the second cycle, and the converted voltage command value for the third phase is set to zero or a minimum value during the first cycle.

24. The control device according to claim 21, wherein, with respect to a command value ratio which is a ratio of the converted voltage command value in the predetermined time range or the remaining time range to the original voltage command value, a command value ratio for the first phase is equal to a command value ratio for the second phase.

25. The control device according to claim 21, wherein, with respect to a command value ratio which is a ratio of the converted voltage command value in the predetermined time range or the remaining time range to the original voltage command value, a command value ratio for the first phase is different from a command value ratio for the second phase.

26. The control device according to claim 24,
wherein the command value ratio is changed in accordance with an output voltage of each phase, a phase angle of the output voltage of each phase, or a phase angle of an output current of each phase.

27. The control device according to claim 25, the control device being further configured to change between a first mode and a second mode;
the first mode being a mode in which the converted voltage command value of the first phase is configured such that the output voltage of the first phase during the predetermined period is not less than the time average of the target voltage of the first phase to be output in the cycle of the carrier, and that the output voltage of the first phase during the remaining period is less than the time average of the target voltage of the first phase, and in which the converted voltage command value of the second phase is configured such that the output voltage of the second phase during the predetermined period is less than the time average of the target voltage of the second phase to be output in the cycle of the carrier, and that the output voltage of the second phase during the remaining period is not less than the time average of the target voltage of the second phase, and the second mode being a mode in which the converted voltage command value of the first phase and the converted voltage command value of the second phase are configured such that the output voltages of the first and second phases during the predetermined period are not less than the time averages of the target voltages of the first and second phases to be output in the cycle of the carrier respectively, and that the output voltages of the first and second phases during the remaining period are less than the time averages of the target voltages of the first and second phases respectively.

28. The control device according to claim 25,
wherein the command value ratio is changed in accordance with an output voltage of each phase, a phase angle of the output voltage of each phase, or a phase angle of an output current of each phase.

29. An inverter comprising a plurality of series circuits, each of the series circuits being formed by two semiconductor switching elements being connected in series, a connection point between the two semiconductor switching elements being used as one of output terminals of polyphase alternate-current (AC) electrical power, the series circuits being connected in parallel with each other with respect to a capacitor connected in parallel with a direct-current (DC) voltage source,
the inverter being configured, in controlling the semiconductor switching elements by using PWM pulses obtained by comparing output voltage command values of respective phases with a carrier,
to generate modified PWM pulses of respective phases based on an output of a counter common to the respective phases; and
to control the semiconductor switching elements by using the modified PWM pulses,
wherein each of the modified PWM pulses is configured such that, in a period corresponding to one or more cycles of the carrier, a sum of one or more ON periods of the modified PWM pulse is substantially equal to a sum of one or more ON periods of a PWM pulse of a corresponding phase among the respective phases, the PWM pulse being obtained by comparing a voltage command value with the carrier, and
at least one of a generation timing and a generation frequency of the ON periods of at least one of the modified PWM pulses is different from the PWM pulse, exceeding a necessary extent for control.

30. The inverter according to claim 29, wherein the inverter is a three-phase inverter including the three series circuits, and
the inverter is configured, in a case in which the modified PWM pulses of the period corresponding to one or more cycles of the carrier is to be generated,
to generate a modified PWM pulse for a first phase for controlling the semiconductor switching elements so as to hold an AC output voltage of the first phase at a voltage of a positive electrode or a negative electrode of the DC voltage source,
to use a converted voltage command value for a second phase for generating a modified PWM pulse for the second phase in which at least one of the generation timing and the generation frequency is changed from the PWM pulse, and
to use a converted voltage command value for a third phase for generating a modified PWM pulse for the third phase in which at least one of the generation timing and the generation frequency is changed from the PWM pulse.

31. The inverter according to claim 29, the inverter being a three-phase inverter including the three series circuits, the inverter further including a control device including a voltage command value generator for generating the output voltage command value of each phase, a comparator for generating the modified PWM pulses by comparing the carrier with the output voltage command value of each phase, and a distributer for generating actuation pulses to actuate all the semiconductor switching elements based on the PWM pulses;
wherein the comparator is configured to use,
for each phase, a converted voltage command value for a predetermined period within a cycle of the carrier and a converted voltage command value for a remaining period within the cycle of the carrier as the output voltage command value; and
the voltage command value generator is configured to generate the converted voltage command value for the predetermined period and the converted voltage command value for the remaining period by increasing or decreasing an original voltage command value used for causing the three-phase inverter to output a target voltage, such that a time average value of the converted voltage command value during the cycle of the carrier becomes equal to the original voltage command value, wherein in a case in which magnitude of the carrier is not less than 0 and not more than 1, the converted voltage command values of respective three phases ($D_{UA}$, $D_{VA}$, and $D_{WA}$) generated by increasing the original voltage command values and the converted voltage command values of the respective three phases ($D_{UB}$, $D_{VB}$, and $D_{WB}$) generated by decreasing the original voltage command values are expressed by following formulas:

$D_{UA}=A_U \cdot D_U$ (if $1 \le A_U \cdot D_U$, $D_{UA}=1$)

$D_{UB}=2D_U-D_{UA}$ $D_{VA}=A_V \cdot D_V$ (if $1 \le A_V \cdot D_V$, $D_{VA}=1$)

$D_{VB}=2D_V-D_{VA}$ $D_{WA}=A_W \cdot D_W$ (if $1 \le A_W \cdot D_W$, $D_{WA}=1$)

$D_{WB}=2D_W-D_{WA}$ wherein $D_U$, $D_V$, and $D_W$ are the original voltage command values of the respective three phases,
$A_U$, $A_V$, and $A_W$ are selectable ratios defined for the respective three phases,
and $0 \le D_U, D_V, D_W \le 1$.

* * * * *